US010916542B2

(12) United States Patent
Chen et al.

(10) Patent No.: US 10,916,542 B2
(45) Date of Patent: Feb. 9, 2021

(54) RECESSED STI AS THE GATE DIELECTRIC OF HV DEVICE

(71) Applicant: Taiwan Semiconductor Manufacturing Company, Ltd., Hsin-Chu (TW)

(72) Inventors: Yi-huan Chen, Hsin-Chu (TW); Kong-Beng Thei, Pao-Shan Village (TW); Fu-Jier Fan, Hsin-Chu (TW); Ker-Hsiao Huo, Zhubei (TW); Kau-Chu Lin, Taichung (TW); Li-Hsuan Yeh, Taipei (TW); Szu-Hsien Liu, Zhubei (TW); Yi-Sheng Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/061,709

(22) Filed: Mar. 4, 2016

(65) Prior Publication Data

US 2017/0194320 A1    Jul. 6, 2017

Related U.S. Application Data

(60) Provisional application No. 62/272,854, filed on Dec. 30, 2015.

(51) Int. Cl.
| | |
|---|---|
| *H01L 29/66* | (2006.01) |
| *H01L 27/088* | (2006.01) |
| *H01L 21/8234* | (2006.01) |
| *H01L 29/423* | (2006.01) |
| *H01L 27/092* | (2006.01) |

(Continued)

(52) U.S. Cl.
CPC .... *H01L 27/088* (2013.01); *H01L 21/823418* (2013.01); *H01L 21/823462* (2013.01); *H01L 21/823481* (2013.01); *H01L 21/823493* (2013.01); *H01L 27/0922* (2013.01); *H01L 29/42364* (2013.01); *H01L 29/42368* (2013.01); *H01L 29/66545* (2013.01); *H01L 29/66621* (2013.01); *H01L 21/823456* (2013.01); *H01L 29/0692* (2013.01); *H01L 29/1083* (2013.01); *H01L 29/1087* (2013.01)

(58) Field of Classification Search
None
See application file for complete search history.

(56) References Cited

U.S. PATENT DOCUMENTS

| | | |
|---|---|---|
| 7,252,018 B2 | 8/2007 | Hormann |
| 8,524,570 B2 | 9/2013 | Chuang et al. |

(Continued)

FOREIGN PATENT DOCUMENTS

| | | |
|---|---|---|
| CN | 102315109 A | 1/2012 |
| CN | 103811549 A | 5/2014 |

*Primary Examiner* — Abul Kalam
(74) *Attorney, Agent, or Firm* — Slater Matsil, LLP

(57) ABSTRACT

A method includes forming an isolation region extending into a semiconductor substrate, etching a top portion of the isolation region to form a recess in the isolation region, and forming a gate stack extending into the recess and overlapping a lower portion of the isolation region. A source region and a drain region are formed on opposite sides of the gate stack. The gate stack, the source region, and the drain region are parts of a Metal-Oxide-Semiconductor (MOS) device.

20 Claims, 21 Drawing Sheets

(51) Int. Cl.
*H01L 29/10* (2006.01)
*H01L 29/06* (2006.01)

(56) References Cited

U.S. PATENT DOCUMENTS

| | | | |
|---|---|---|---|
| 9,589,954 B2 * | 3/2017 | Mitsuiki | ......... H01L 21/823418 |
| 9,691,895 B2 * | 6/2017 | Liu | ....................... H01L 27/088 |
| 9,721,806 B2 | 8/2017 | Fang | |
| 2009/0085112 A1 | 4/2009 | Ho et al. | |
| 2010/0264481 A1 * | 10/2010 | Shin | ....................... H01L 27/115 |
| | | | 257/324 |
| 2012/0001259 A1 | 1/2012 | Chuang et al. | |
| 2012/0074498 A1 | 3/2012 | Chuang et al. | |
| 2014/0117444 A1 * | 5/2014 | Liu | ....................... H01L 27/088 |
| | | | 257/337 |
| 2016/0056233 A1 * | 2/2016 | Mitsuiki | ......... H01L 21/823418 |
| | | | 257/401 |
| 2016/0111488 A1 | 4/2016 | Lu et al. | |
| 2016/0141298 A1 | 5/2016 | Chuang et al. | |
| 2017/0040984 A1 | 2/2017 | Park | |

\* cited by examiner

RECESSED STI AS THE GATE DIELECTRIC OF HV DEVICE

PRIORITY CLAIM AND CROSS-REFERENCE

This application claims the benefit of U.S. Provisional Application No. 62/272,854, filed on Dec. 30, 2015, entitled "Recessed STI as the Gate Dielectric of HV Device," which application is hereby incorporated herein by reference.

BACKGROUND

High-Voltage Metal-Oxide-Semiconductor (HVMOS) devices are widely used in many electrical devices, such as Central Processing Unit (CPU) power supplies, power management systems, AC/DC converters, etc.

HVMOS devices have different structures than Medium-Voltage Metal-Oxide-Semiconductor (MVMOS) devices and Low-Voltage Metal-Oxide-Semiconductor (LVMOS) devices. In order to sustain high voltages applied between the gate and the drain of a HVMOS device, the gate dielectric of the HVMOS device is thicker than a gate dielectric of a MVMOS device and a gate dielectric of a LVMOS device. In addition, the doping concentrations of high-voltage well-regions are lower than that of the well regions of MVMOS devices and LVMOS devices in order to sustain higher gate-drain voltage.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
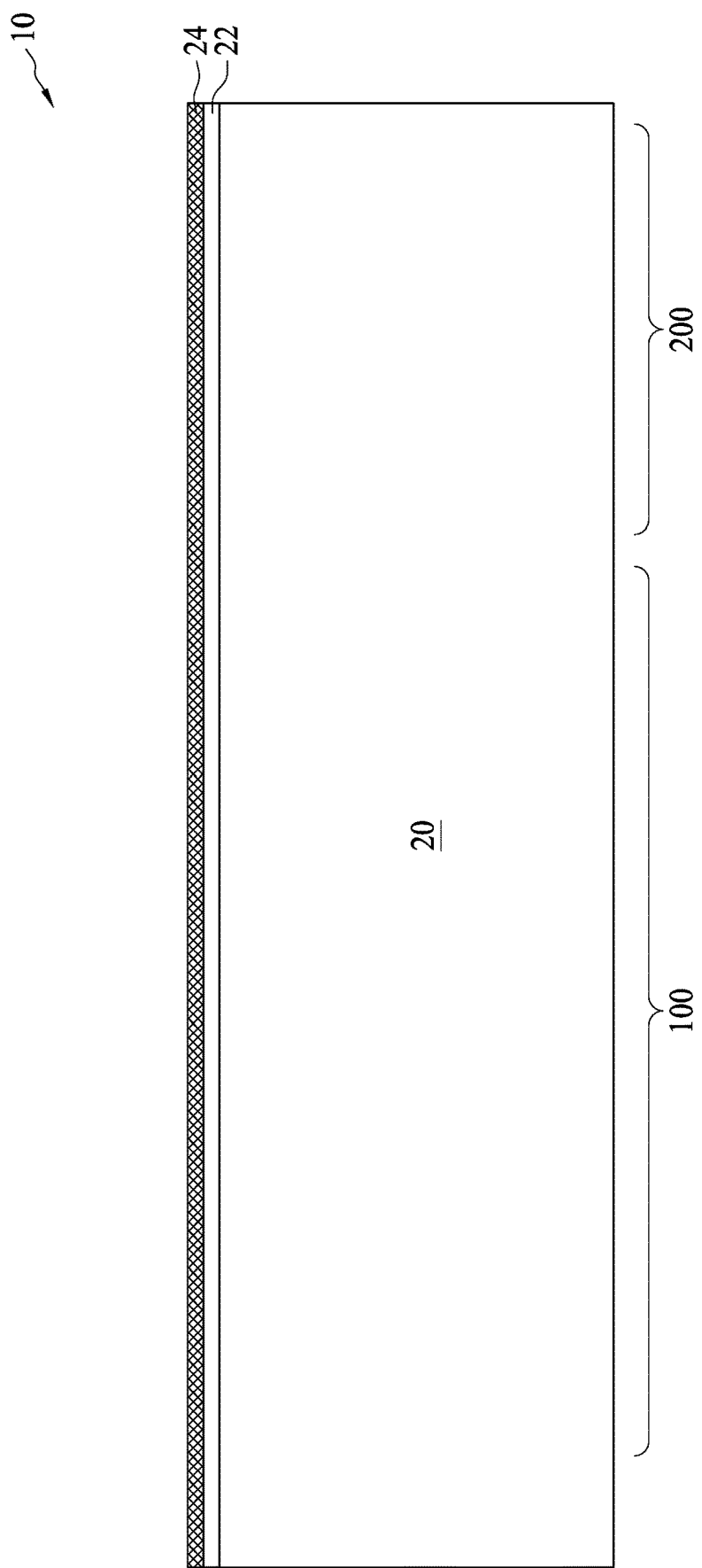
FIGS. 1 through 18 illustrate the cross-sectional views of intermediate stages in the formation of an n-type High-Voltage Metal-Oxide-Semiconductor (HVMOS) device and an n-type Medium-Voltage Metal-Oxide-Semiconductor (MVMOS) (or Low-Voltage Metal-Oxide-Semiconductor (LVMOS)) device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A High-Voltage (HV) Metal-Oxide-Semiconductor (MOS) device and the method of forming the same are provided in accordance with various exemplary embodiments. The intermediate stages of forming the HV MOS device are illustrated. Some variations of some embodiments are discussed. Throughout the various views and illustrative embodiments, like reference numbers are used to designate like elements.

Figure 21:
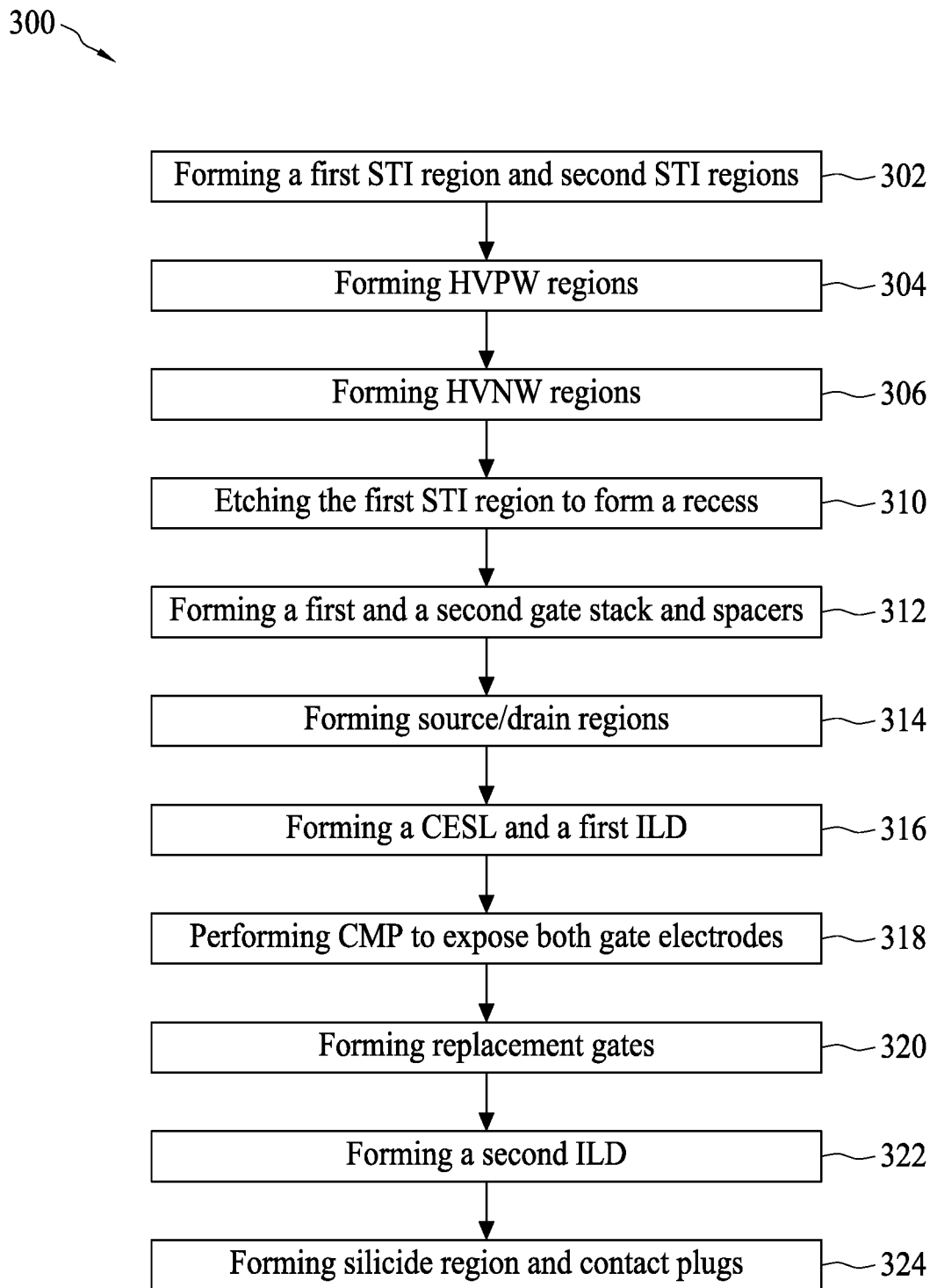
FIG. 21 illustrates a process flow for forming a HVMOS device and a MV/LV MOS device in accordance with some embodiments.

FIGS. 1 through 18 illustrate the cross-sectional views of intermediate stages in the formation of a HV MOS device in accordance with some embodiments. The steps shown in FIGS. 1 through 18 are also illustrated schematically in the process flow 300 shown in FIG. 21.

FIG. 1 illustrates wafer 10, which includes semiconductor substrate 20 and the features formed at a top surface of semiconductor substrate 20. In accordance with some embodiments of the present disclosure, semiconductor substrate 20 comprises crystalline silicon, crystalline germanium, silicon germanium, a III-V compound semiconductor such as GaAsP, AlInAs, AlGaAs, GaInAs, GaInP, GaInAsP, and/or the like. Semiconductor substrate 20 may also be a bulk semiconductor substrate or a semiconductor-On-Insulator (SOI) substrate. In accordance with some exemplary embodiments, semiconductor substrate 20 is of p-type, and has an impurity concentration lower than about $10^{15}/cm^2$.

Semiconductor substrate 20 includes a first portion in device region 100 and a second portion in device region 200. Device region 100 is a HV device region in which HV MOS device 186 (FIG. 18) is to be formed. Device region 200 is a device region in which MOS device 286 (FIG. 18) is to be formed. MOS device 286 is configured to operate at operation voltages (and power supply voltages) lower than the respective operation voltages (and power supply voltages) of HV MOS device 186. In accordance with some exemplary embodiments, device region 200 is a Low-Voltage (LV) MOS device region or a medium-Voltage (MV) MOS device region. It is appreciated that the concept of HV, MV, and LV is relative to each other. The HV MOS devices are configured to operate at (and having power supply voltages) higher than that of the MV MOS devices, and the MV MOS devices are configured to operate at (and having power supply voltages) higher than that of the LV MOS devices. Also, the maximum voltages that can be endured (without being damaged) by MV devices are lower than the maximum voltages that can be endured (without being damaged) by HV devices, and the maximum voltages that can be endured (without being damaged) by LV devices are lower than the maximum voltages that can be endured (without being damaged) by MV devices. In accordance with some exemplary embodiments, the operation voltages of the HV MOS devices are between about 3.0 V and about 3.3 V, the operation voltages and power supply voltages of the MV MOS devices are between about 1.5 V and about 2.0 V, and the operation voltages and power supply voltages of the LV MOS devices are between about 0.7 V and about 1.0V.

FIGS. 1 through 4 illustrate the formation of Shallow Trench Isolation (STI) regions. The respective step is shown as step 302 in the process flow shown in FIG. 21. Referring to FIG. 1, pad layer 22 and mask layer 24 are formed on semiconductor substrate 20. Pad layer 22 may include a thin film formed of silicon oxide, which may be formed, for example, using a thermal oxidation process. Pad layer 22 may act as an adhesion layer between semiconductor substrate 20 and mask layer 24. Pad layer 22 may also act as an etch stop layer for etching mask layer 24. In accordance with some embodiments of the present disclosure, mask layer 24 is formed of silicon nitride, for example, using Low-Pressure Chemical Vapor Deposition (LPCVD). In accordance with other embodiments, mask layer 24 is formed by thermal nitridation of silicon, Plasma Enhanced Chemical Vapor Deposition (PECVD), or plasma anodic nitridation. Mask layer 24 is used as a hard mask during subsequent photolithography process. Photo resist 26 is formed on mask layer 24 and is then patterned to form openings 28.

Figure 2:
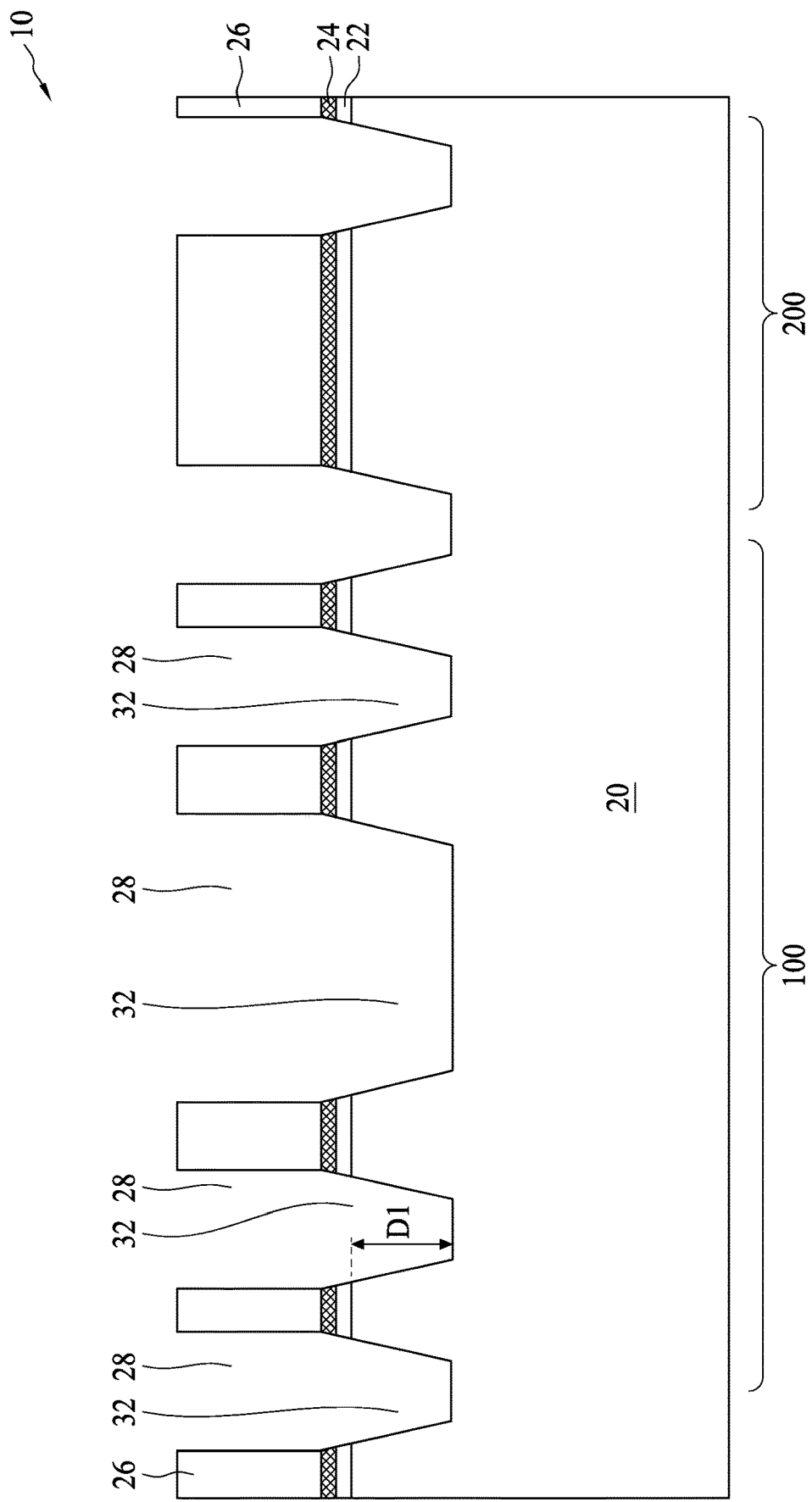

Referring to FIG. 2, mask layer 24 and pad layer 22 are etched through openings 28, exposing underlying semiconductor substrate 20. The exposed semiconductor substrate 20 is then etched, forming trenches 32. Photo resist 26 is then removed. Next, a cleaning may be performed to remove a native oxide of semiconductor substrate 20. The cleaning may be performed using diluted HF.

Figure 3:
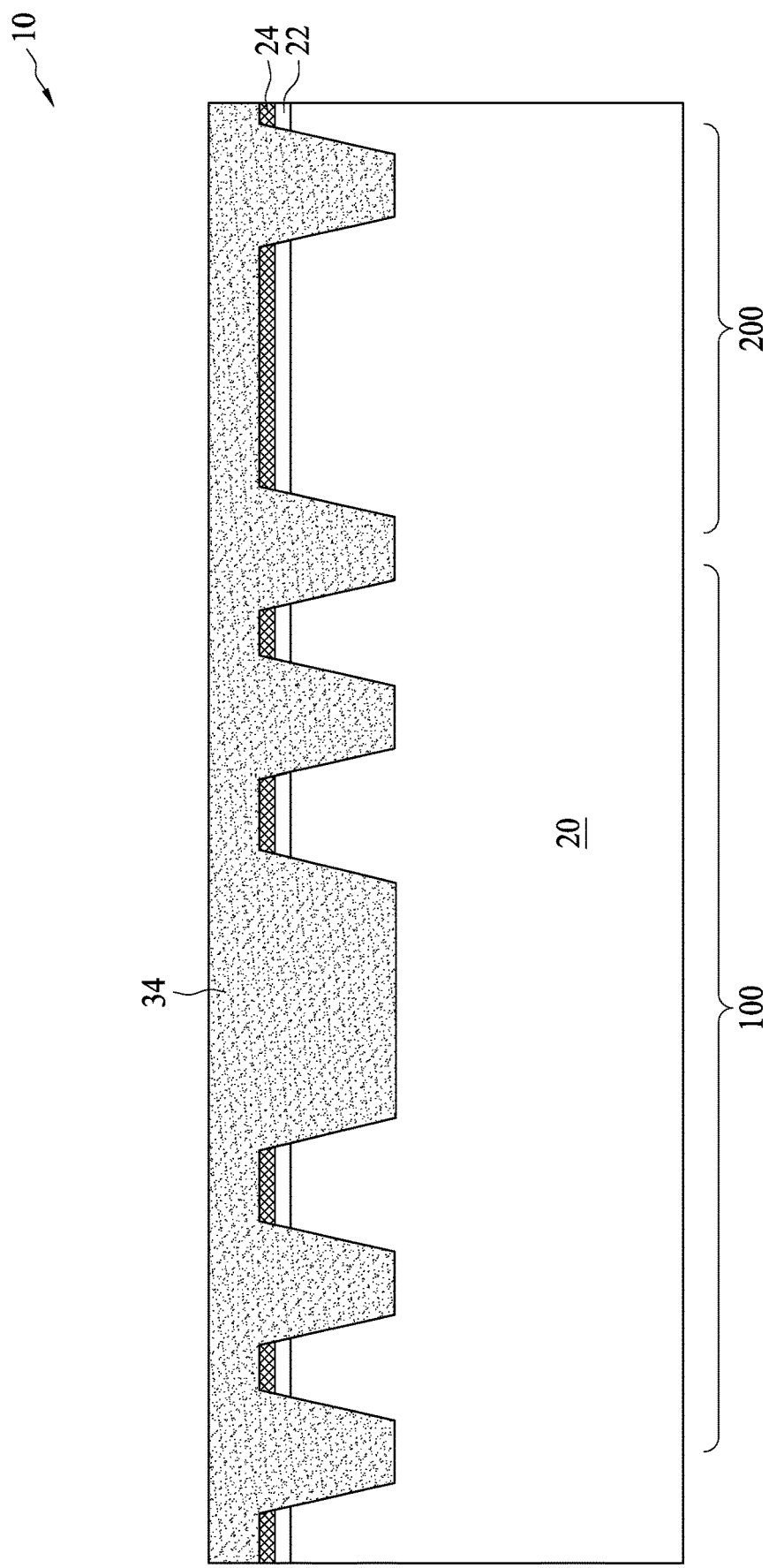

Next, as shown in FIG. 3, dielectric material(s) 34 is filled into trenches 32. In accordance with some embodiments of the present disclosure, dielectric material 34 includes a liner oxide lining the bottoms and the sidewalls of opening 32. The liner oxide may be a thermal oxide layer forming by oxidizing a surface layer of the exposed substrate 20. In accordance with alternative embodiments of the present disclosure, the liner oxide is formed using In-Situ Steam Generation (ISSG). In accordance with other embodiments, the liner oxide is formed using a deposition technique that can form conformal oxide layers, such as Atomic Layer Deposition (ALD), Selective Area Chemical Vapor Deposition (SACVD), or the like. The formation of the liner oxide rounds the corners of trenches 32 (FIG. 2), which results in the reduction of electrical fields, and hence the improvement in the performance of the resulting integrated circuits.

After the formation of the liner oxide, the remaining portions of trenches 32 are filled with another dielectric material. In accordance with some embodiments of the present disclosure, the filling material includes silicon oxide, and other dielectric materials such as SiN, SiC, SiON, or the like, may also be used. The filling dielectric material may be filled using High Aspect Ratio Process (HARP), High Density Plasma Chemical Vapor Deposition (HDP), SACVD, Atmospheric Pressure Chemical Vapor Deposition (APCVD), or the like.

Next, a steam anneal may be performed. The steam anneal may include annealing the structure shown in FIG. 3 at an elevated temperature, for example, between about 600° C. and about 700° C., with steam ($H_2O$) introduced.

Figure 4:
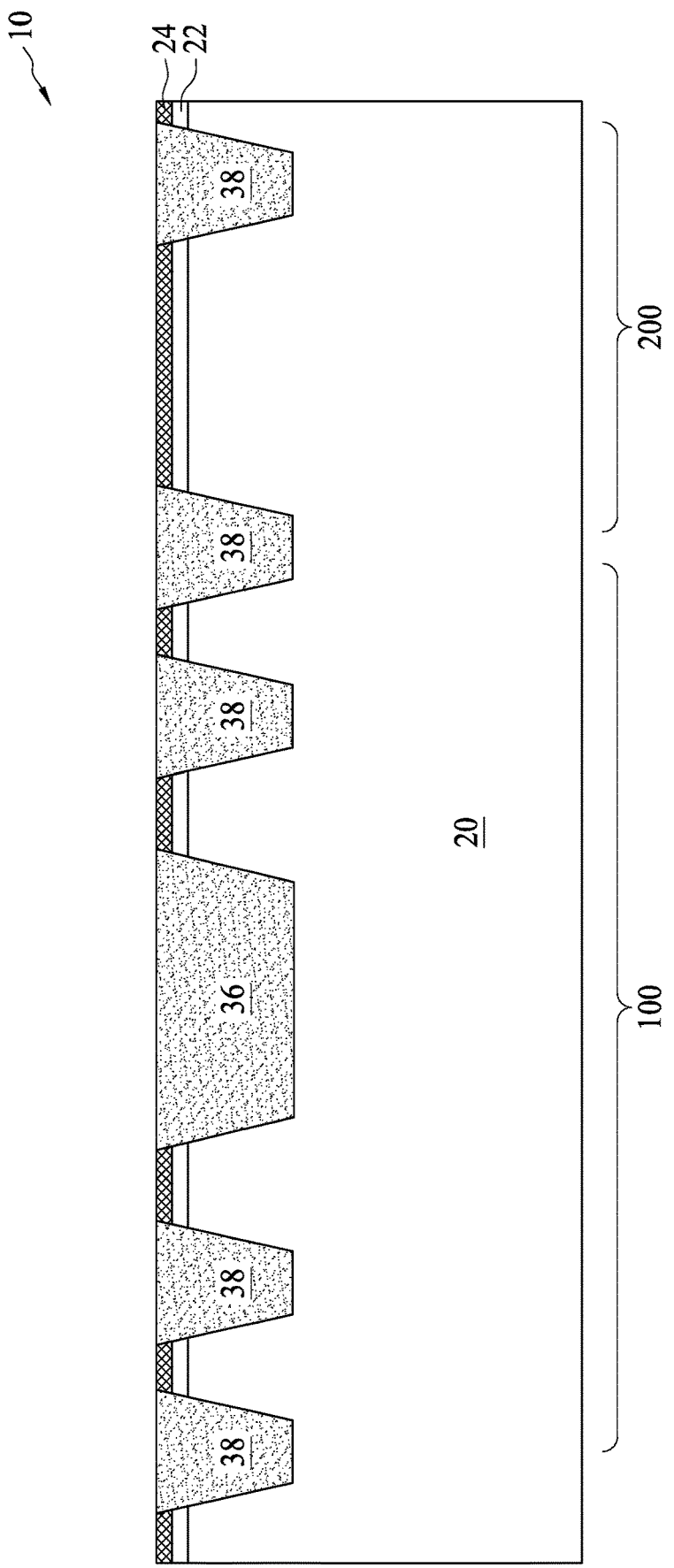

A planarization such as Chemical Mechanical Polish (CMP) is then performed to remove excess portions of dielectric material 34 over the top surface of mask layer 24, resulting in the structure shown in FIG. 4. Mask layer 24 may act as a CMP stop layer. The remaining portion of dielectric material 34 forms Shallow Trench Isolation (STI) regions 36 and 38. As shown in FIG. 4, the bottom surfaces of STI regions 36 and 38 are substantially level with each other, for example, with the height difference smaller than about 10 percent of the heights of STI regions 36 and 38.

Figure 5:
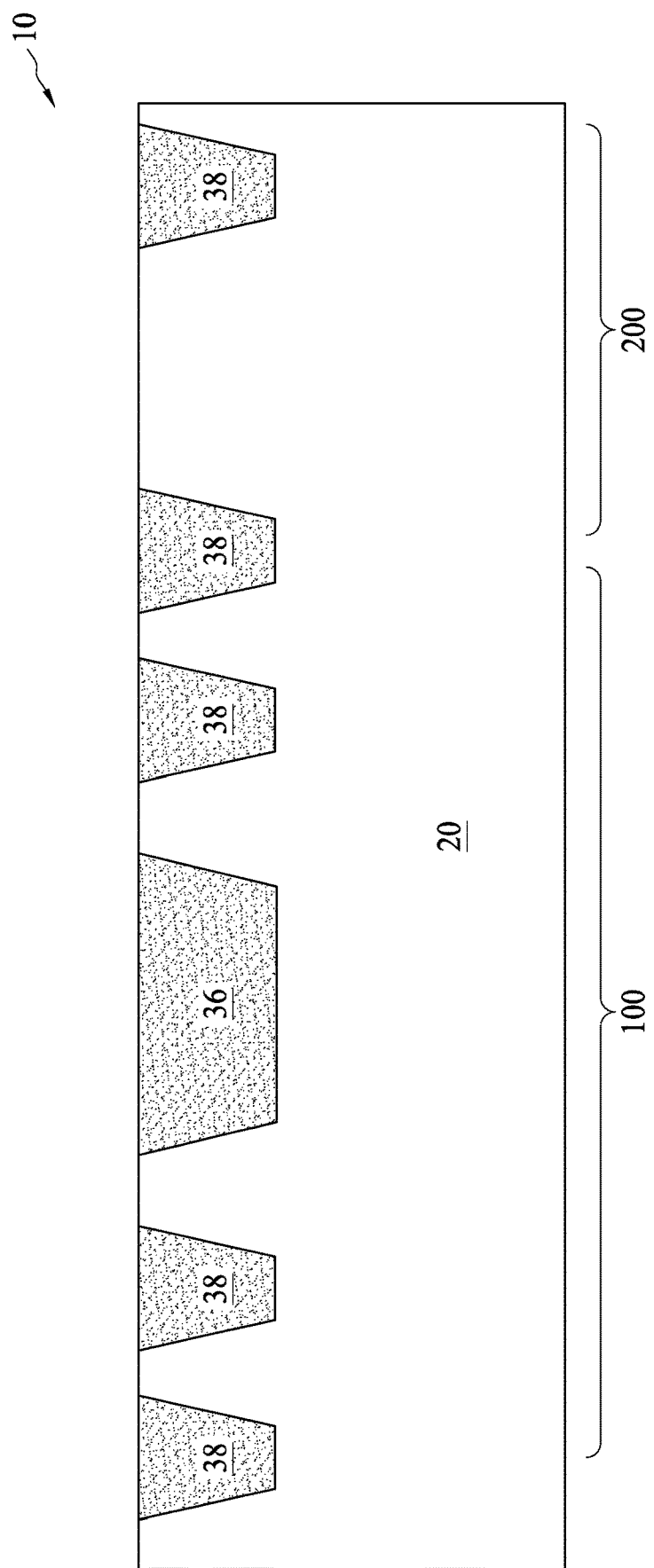

In subsequent steps, mask layer 24 and pad layer 22 are removed, followed by some cleaning processes, and the resulting structure is shown in FIG. 5. Mask layer 24, when formed of silicon nitride, may be removed by a wet clean process using hot $H_3PO_4$, while pad layer 22, when formed of silicon oxide, may be removed in a wet etching process using diluted HF.

Figure 6:
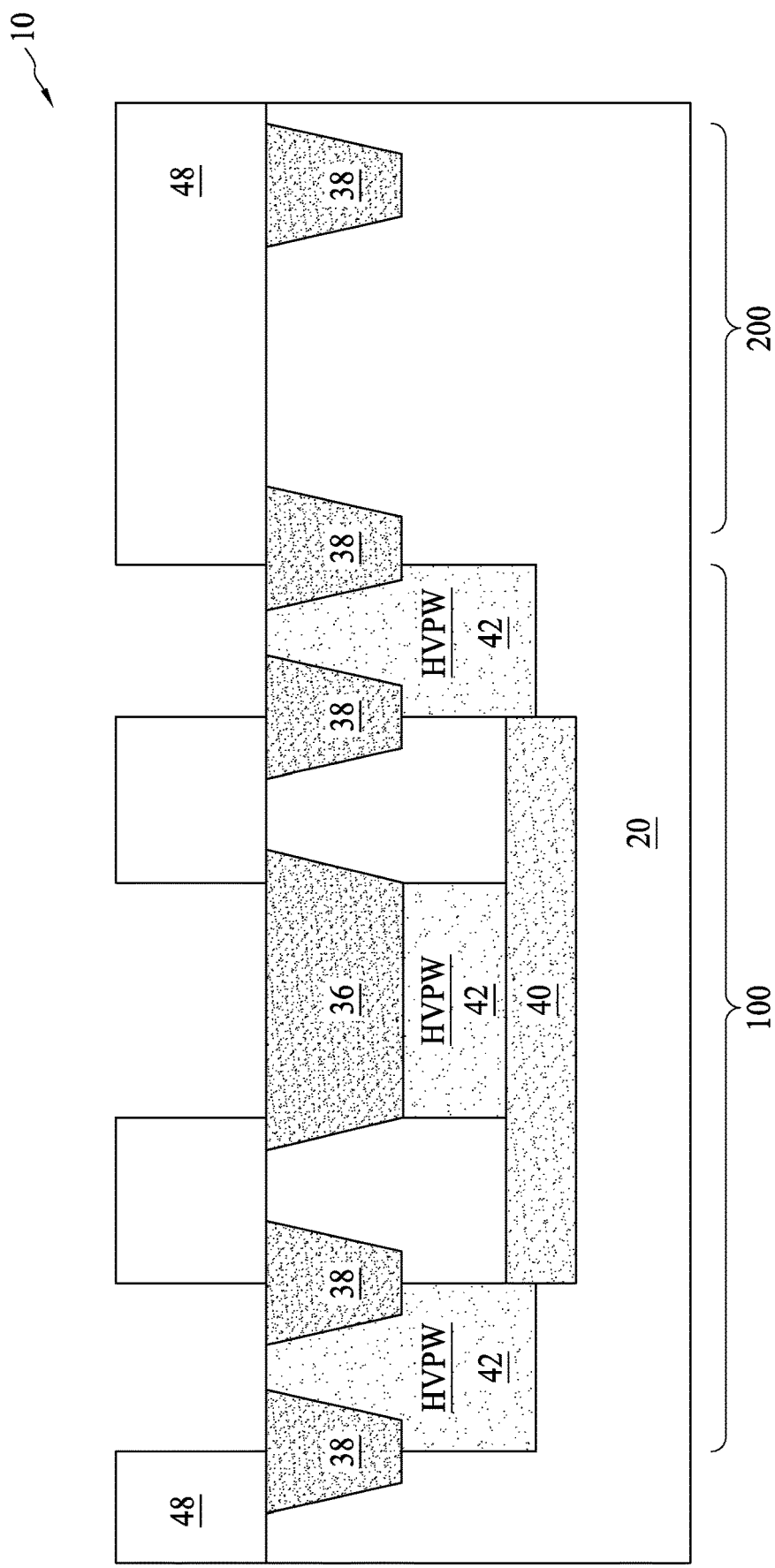
Figure 7:
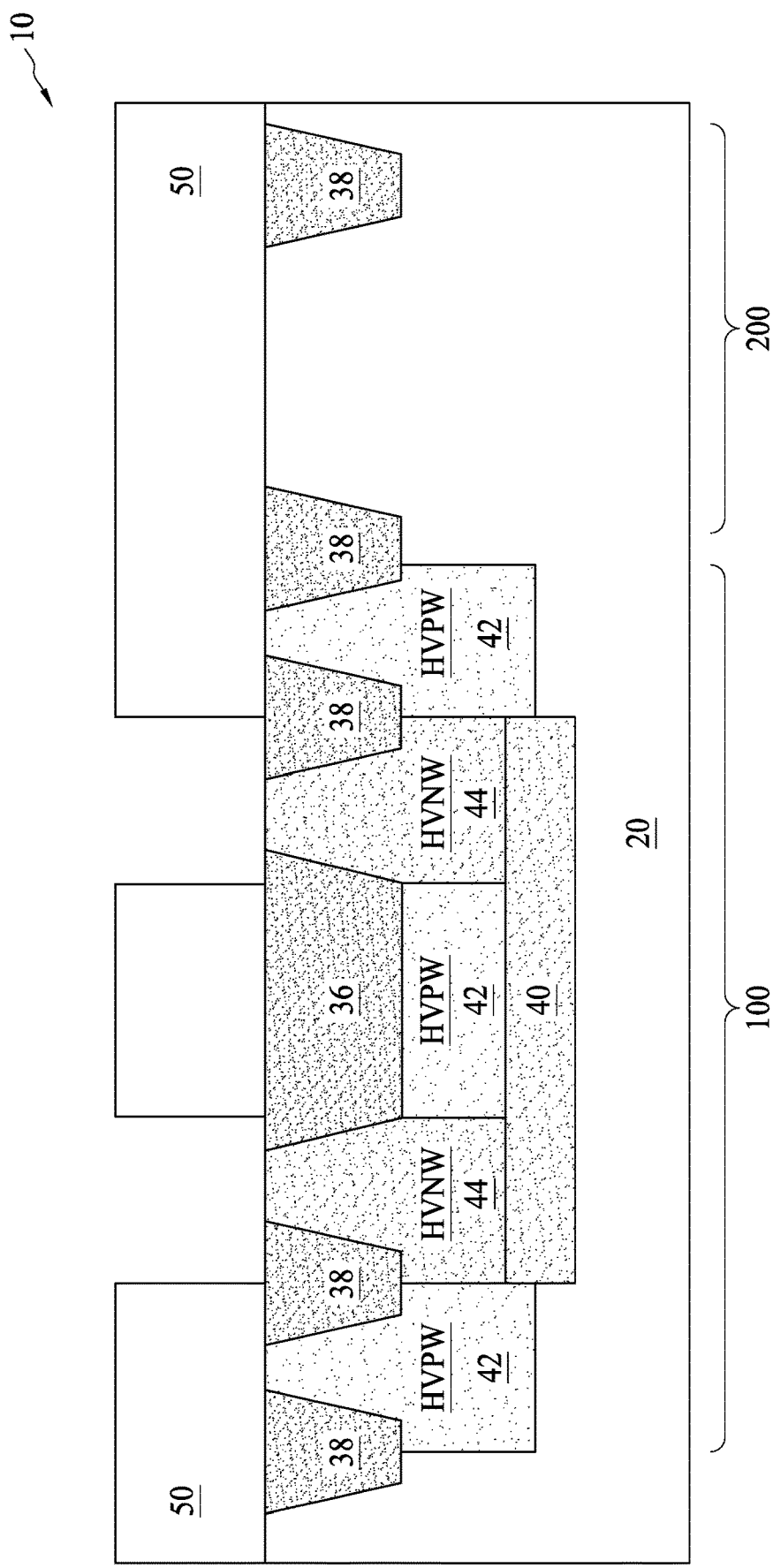
Figure 8:
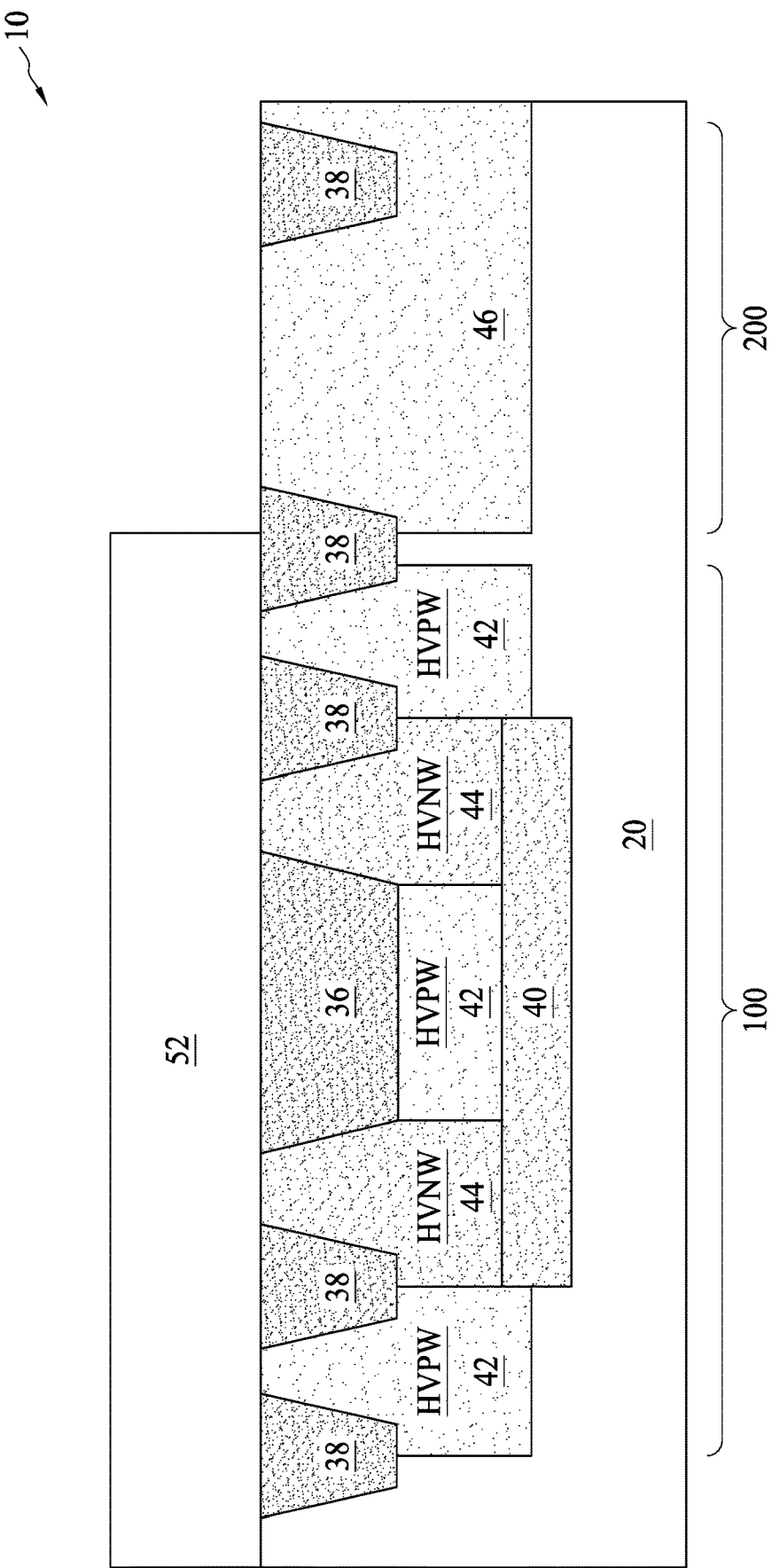

FIGS. 6 through 8 illustrate the formation of a plurality of doped regions through a plurality of implantation processes. The plurality of doped regions includes deep n-well region 40, High-Voltage P-Well (HVPW) regions 42, High-Voltage N-Well (HVNW) regions 44, and p-well region 46. The implantation processes for forming regions 40, 42, 44, and 46 may be arranged in any order. In accordance with some exemplary embodiments, a photo resist (not shown) is formed to cover wafer 10, with the region in which deep n-well region 40 is to be formed exposed to the opening in the photo resist. An n-type impurity such as phosphorous, arsenic, and/or antimony is implanted deep into semiconductor substrate 20 to form deep n-well region 40. The photo resist is then removed.

Next, as shown in FIG. 6, photo resist 48 is formed and patterned. A p-type impurity implantation is then performed in order to form HVPW regions 42. The respective step is shown as step 304 in the process flow shown in FIG. 21. HVPW regions 42 may be implanted with boron and/or indium. After the implantation, HVPW regions 42 may have a p-type impurity concentration between about $10^{15}/cm^3$ and about $10^{16}/cm^3$ in accordance with some exemplary embodiments. Photo resist 48 is then removed.

Next, as shown in FIG. 7, photo resist 50 is formed and patterned. An n-type impurity implantation is then performed in order to form HVNW regions 44. The respective step is shown as step 306 in the process flow shown in FIG. 21. HVNW regions 44 may be implanted with phosphorous, arsenic, or antimony. After the implantation, HVNW regions 44 may have an n-type impurity concentration between about $10^{15}/cm^3$ and about $10^{16}/cm^3$ in accordance with some exemplary embodiments. Photo resist 50 is then removed. The bottoms of HVNW regions 44 are joined to the deep n-well region 40.

FIG. 8 illustrates the formation of p-well region 46 in device region 200. In accordance with some embodiments of the present disclosure, photo resist 52 is formed and patterned to cover device region 100. A p-type impurity implantation is then performed in order to form p-well region 46. P-well region 46 may be implanted with boron or indium. P-well region 46 has a p-type impurity concentration higher than the impurity concentration of HVNW regions 44 and HVPW regions 42. For example, p-well region 46 may have a p-type impurity concentration between about $10^{16}/cm^3$ and about $10^{17}/cm^3$ in accordance with some exemplary embodiments. Photo resist 52 is then removed.

Figure 9:
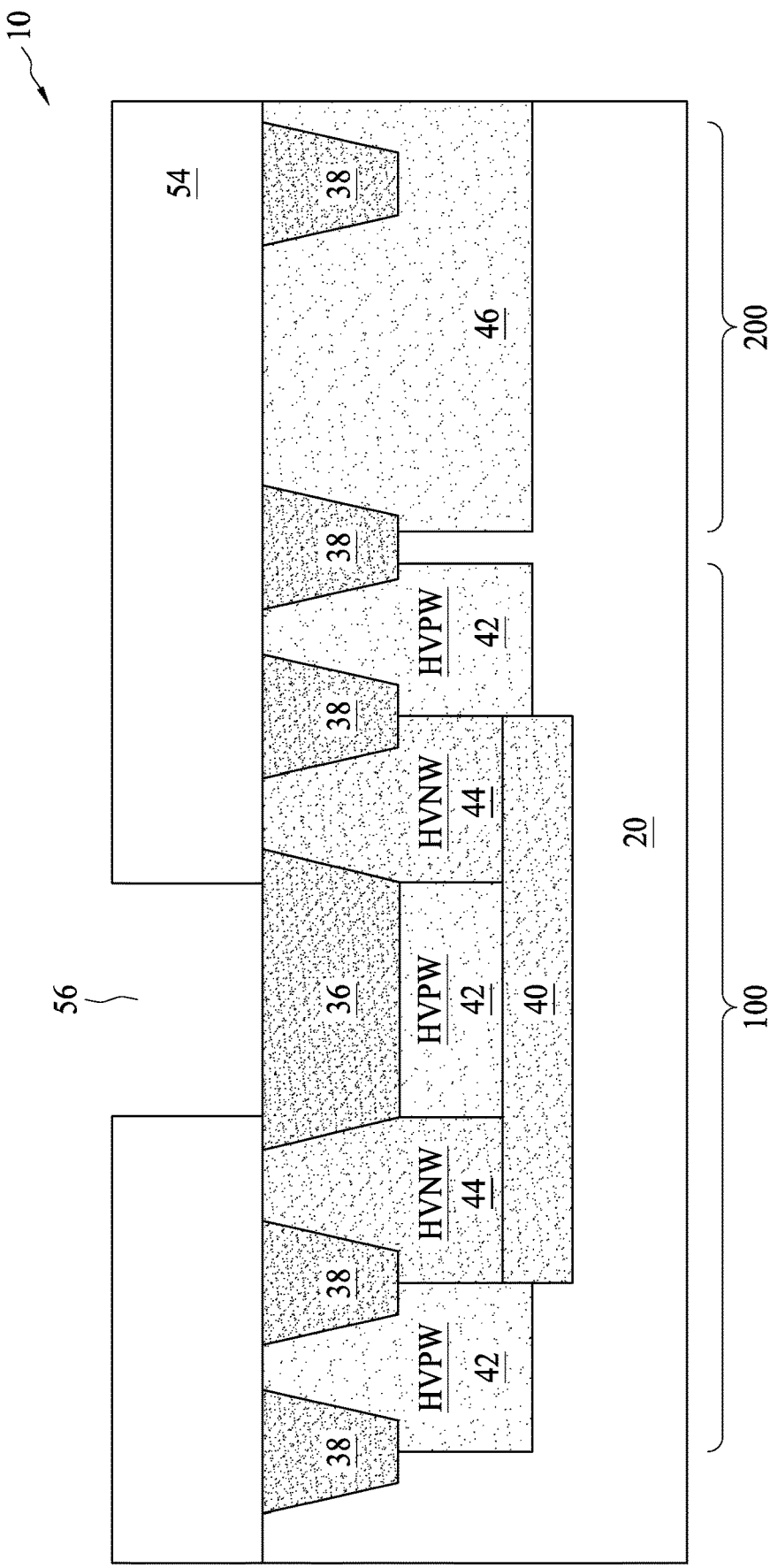

In a subsequent step, as shown in FIG. 9, photo resist 54 is formed and patterned to form opening 56. A middle portion of STI region 36 is exposed through opening 56. STI regions 38, HVNW regions 44, and some HVPW regions 42 are covered by photo resist 54.

Figure 10:
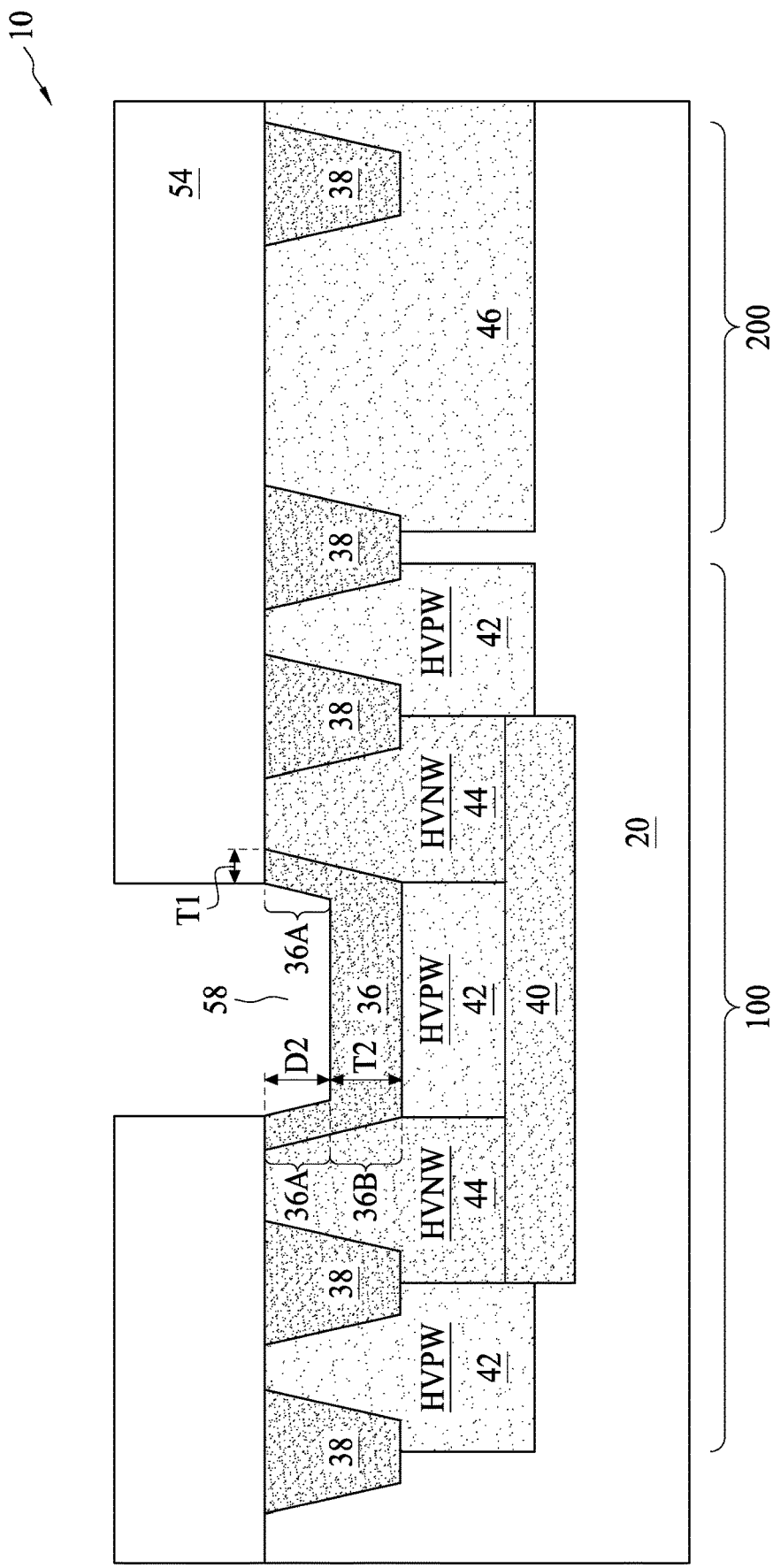

Referring to FIG. 10, a top portion of the exposed STI region 36 is etched, forming recess 58 extending into STI region 36. The respective step is shown as step 310 in the process flow shown in FIG. 21. The etching may be performed through a dry etching process using an etching gas. In accordance with some embodiments of the present disclosure, STI region 36 comprises silicon oxide, and HF is used as the etching gas. The etching may also be performed through a wet etching process using an etching solution. In accordance with some embodiments of the present disclosure, STI region 36 comprises silicon oxide, and an etching solution including diluted HF is used. As a result of the etching, a central upper portion of STI region 36 is removed, while a lower portion 36B of STI region 36 remains. In addition, due to the protection of photo resist 54, the upper portions 36A of STI region 36 remain to be on one side (such as the drain side) or on opposite sides of recess 58.

Figure 11:
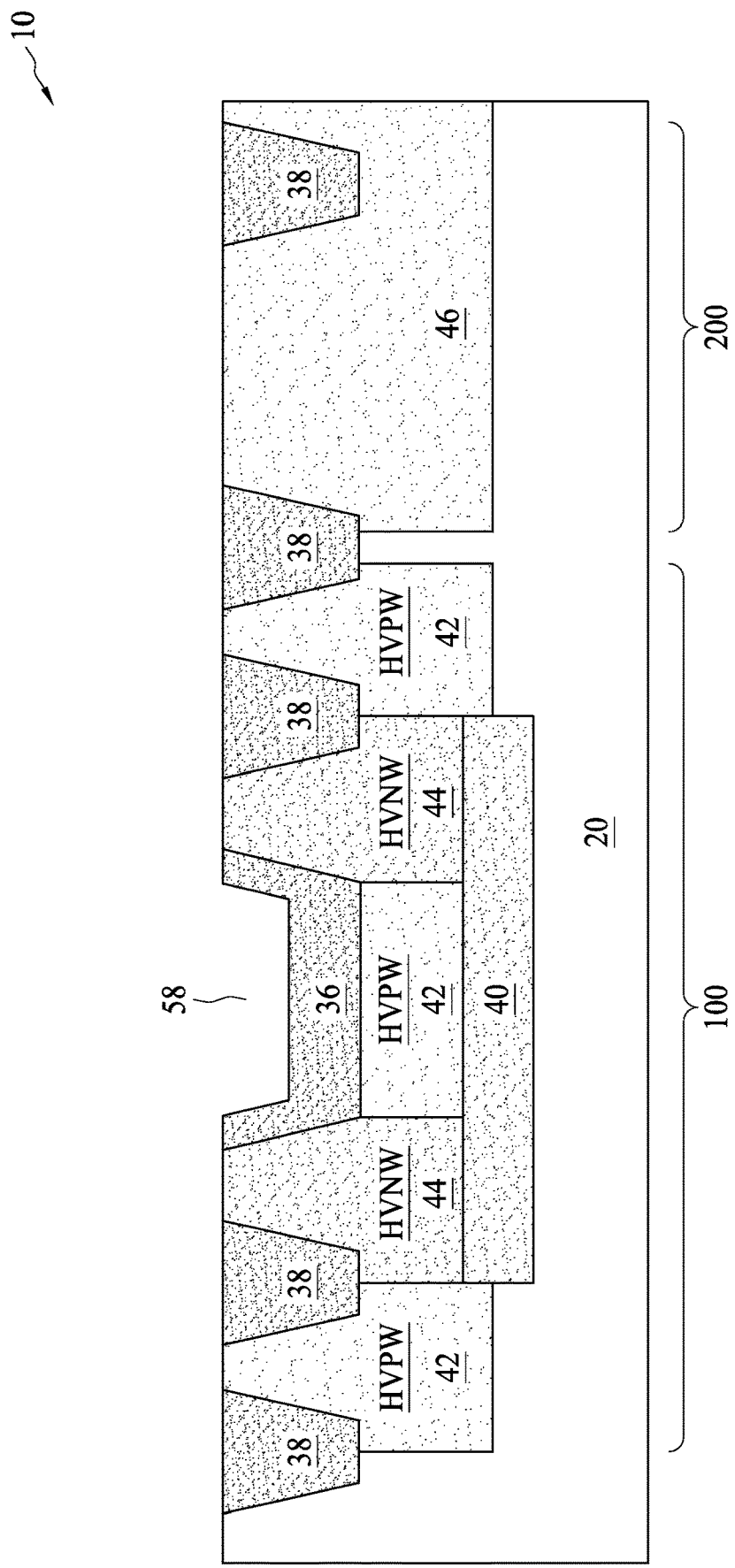

The remaining bottom portion 36B of STI region 36 has thickness T2. The remaining upper portions 36A of STI region 36 have thickness T1. The etching process may be adjusted to adjust the endurable voltage and the saturation current of the resulting HV MOS device. Depth D2 of recess 58 may be in the range between about 500 Å and about 1,400 Å in accordance with some embodiments. The optimal depth D2 is affected by various factors such as the thickness of gate dielectric 276 (FIG. 18), the minimum allowable height of gate stack 274, etc. After the etching, photo resist 54 is removed, as shown in FIG. 11.

Figure 19:
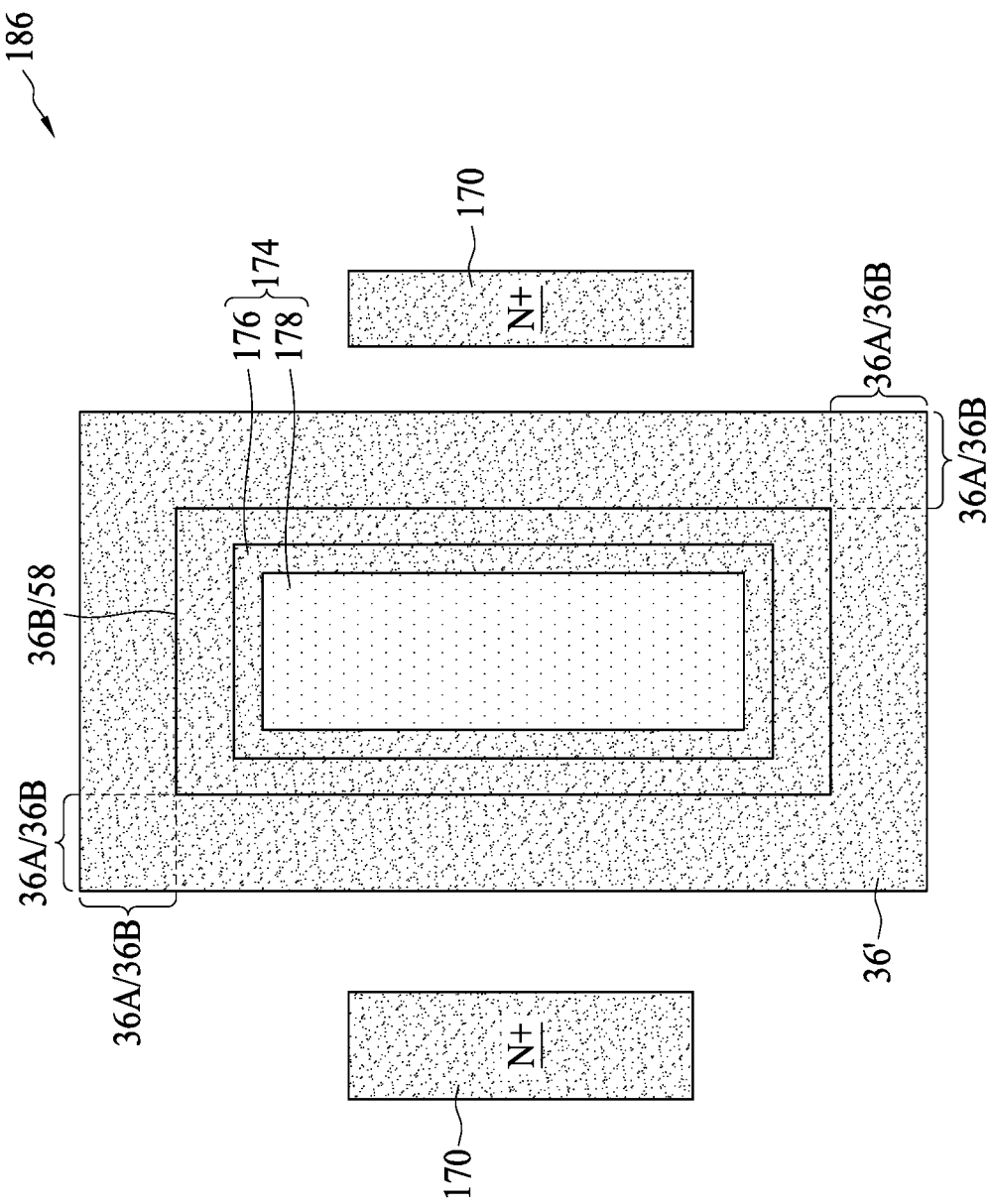
FIG. 19 illustrates a top view of an n-type HVMOS device in accordance with some embodiments.

FIG. 19 illustrates a top view of STI region 36 and the corresponding recess 58 in accordance with some embodiments of the present disclosure. Recess 58 may be surrounded by STI portion 36A. In accordance with other embodiments of the present disclosure, recess 58 extends to edge 36' of STI region 36, wherein edge 36' may be the edge facing one side (such as the source side) of the resulting HVMOS device.

Figure 12:
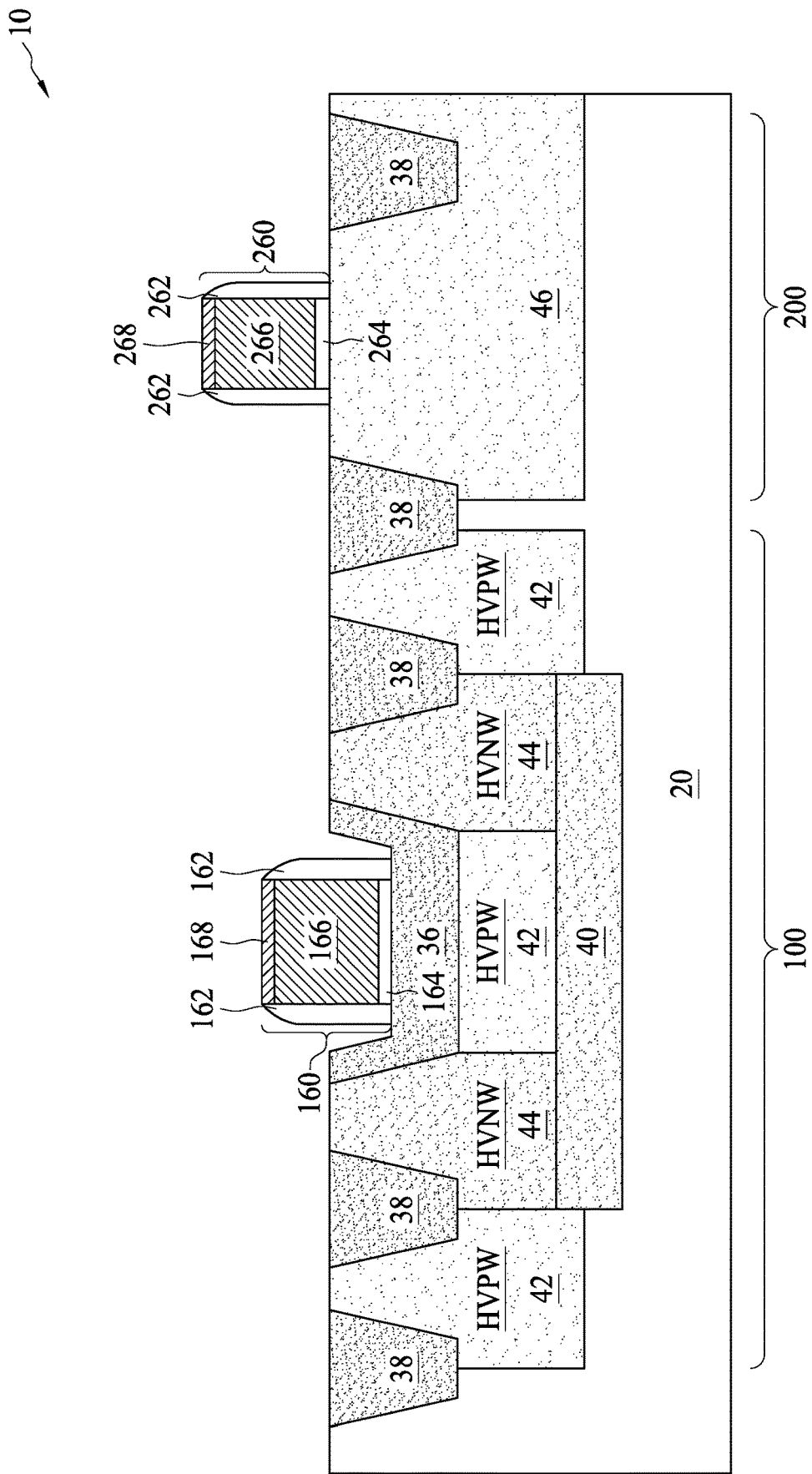

Next, referring to FIG. 12, gate stacks 160 and 260 are formed in device regions 100 and 200, respectively. The respective step is shown as step 312 in the process flow shown in FIG. 21. Gate stacks 160 and 260 may be removed in subsequent steps and replaced by replacement gates. Accordingly, gate stacks 160 and 260 are dummy gates in accordance with some embodiments. Gate stack 160 includes gate dielectric 164 and gate electrode 166. Gate stack 260 includes gate dielectric 264 and gate electrode 266. Gate dielectrics 164 and 264 may be formed of silicon oxide, silicon nitride, silicon carbide, or the like. Gate electrodes 166 and 266 may include polysilicon in accordance with some embodiments. Gate electrodes 166 and 266 may also be formed of other conductive materials such as metals, metal alloys, metal silicides, metal nitrides, and/or the like. In accordance with some embodiments of the present disclosure, gate stacks 160 and 260 further include hard masks 168 and 268, respectively. Hard mask 168 and 268 may be formed of silicon nitride, for example, while other materials such as silicon carbide, silicon oxynitride, and the like may also be used. In accordance with alternative embodiments, hard masks 168 and 268 are not formed.

Gate spacers 162 and 262 are formed on the sidewalls of gate stacks 160 and 260, respectively. The respective step is also shown as step 312 in the process flow shown in FIG. 21. In accordance with some embodiments, each of gate spacers 162 and 262 includes a silicon oxide layer and a silicon nitride layer on the silicon oxide layer. The formation may include depositing blanket dielectric layers, and then performing an anisotropic etching to remove the horizontal portions of the blanket dielectric layers. The available deposition methods include PECVD, Low-Pressure Chemical Vapor Deposition (LPCVD), Sub-Atmospheric Chemical Vapor Deposition (SACVD), and other deposition methods.

Figure 13:
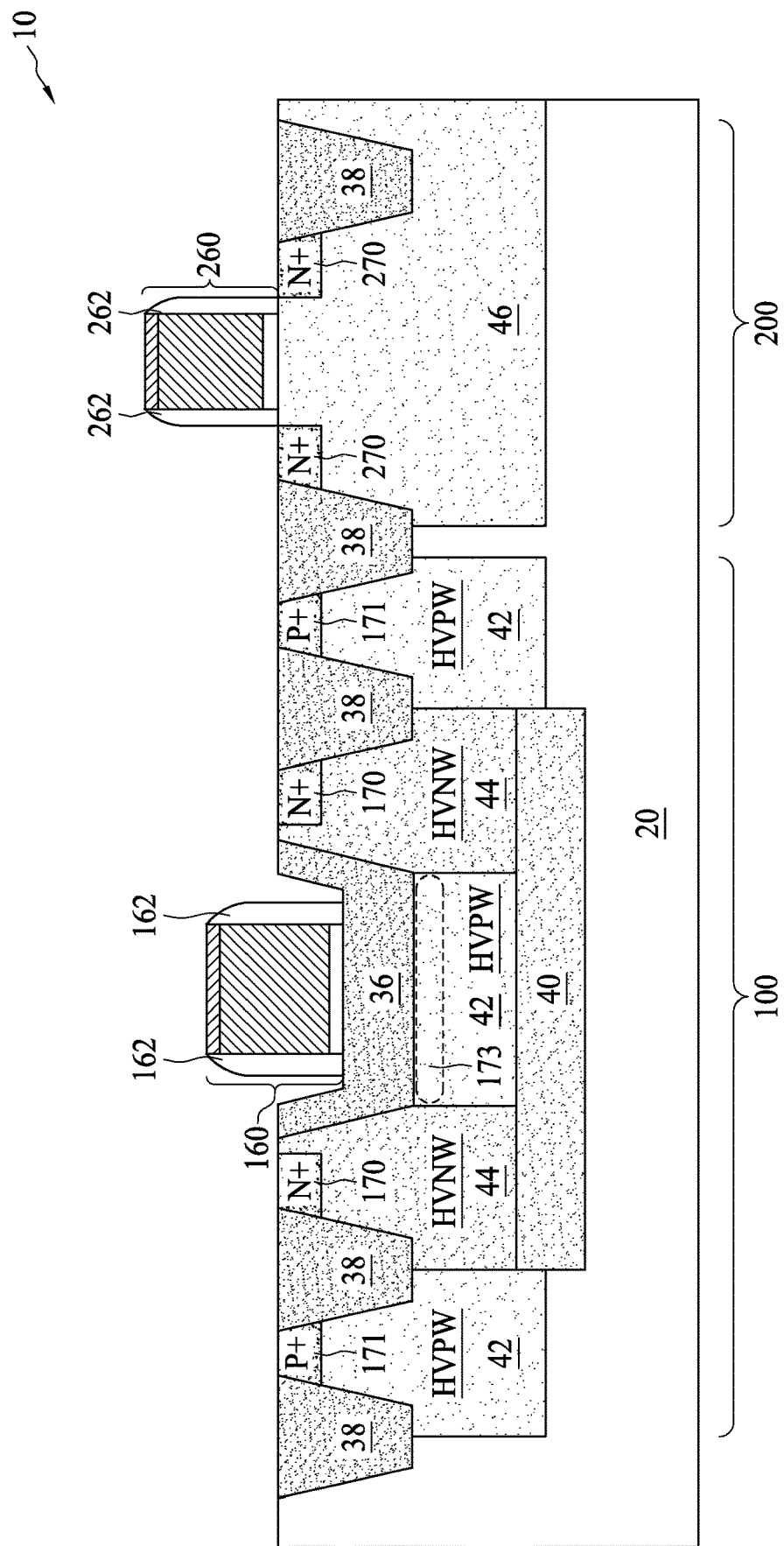

Referring to FIG. 13, source and drain regions (referred to as source/drain regions hereinafter) 170 are formed in HVNW regions 44. One of the source/drain regions 170 acts as the source region, and the other acts as the drain region. A channel 173 is directly underlying STI region 36 for conducting currents between source/drain regions 170. Source/drain regions 270 are also formed in p-well region 46. The respective steps are shown as step 314 in the process flow shown in FIG. 21. Source/drain regions 170 and 270 may be formed simultaneously in a same implantation process. Source/drain regions 170 and 270 are of n-type, and are heavily doped, for example, to an n-type impurity concentration between about $10^{19}/cm^3$ and about $10^{21}/cm^3$, and are referred to as N+ regions. A photo resist (not shown) is formed to define the location of source/drain regions 170 and 270. Source/drain regions 170 may be spaced apart from STI region 36 by HVNW regions 44. On the other hand, source/drain regions 170 may have edges aligned to the edges of gate spacers 262.

In addition, pickup regions 171, which are of p-type, are formed at the surface of HVPW regions 42 through an additional implantation step. P-type pickup regions 171 may also have a p-type impurity concentration between about $10^{19}/cm^3$ and about $10^{21}/cm^3$, and are referred to as P+ regions.

Figure 14:
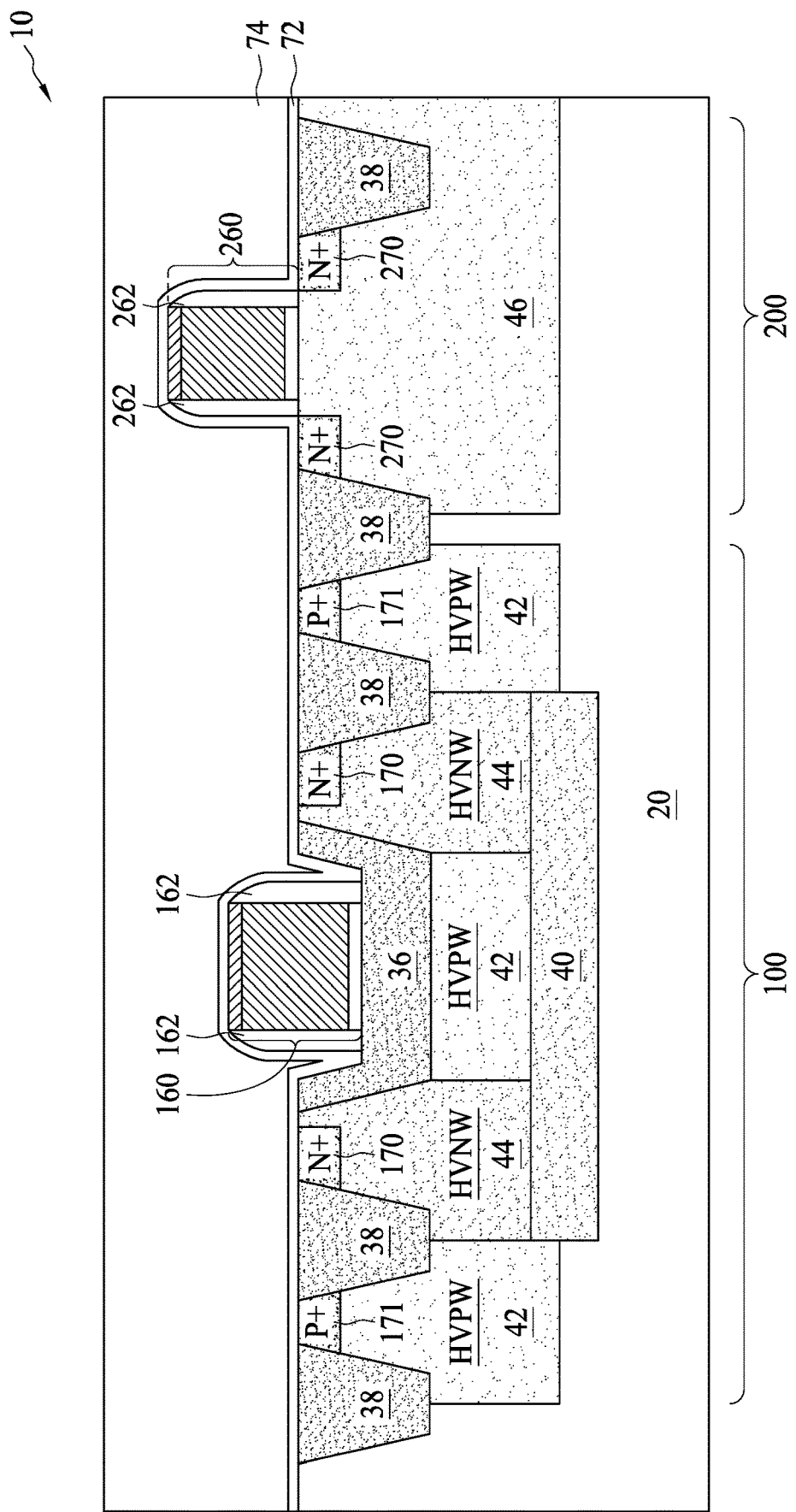

Referring to FIG. 14, Contact Etch Stop Layer (CESL) 72 is formed over gate stacks 160 and 260 and source/drain regions 170 and 270. The respective step is shown as step 316 in the process flow shown in FIG. 21. In accordance with some embodiments of the present disclosure, CESL 72 is formed of a material selected from silicon nitride, silicon carbide, or other dielectric materials. Inter-Layer Dielectric (ILD) 74 is formed over CESL 72. The respective step is also shown as step 316 in the process flow shown in FIG. 21. ILD 74 is blanket formed to a height higher than the top surfaces of gate stacks 160 and 260. ILD 74 may be formed of an oxide using, for example, Flowable Chemical Vapor Deposition (FCVD). ILD 74 may also be a spin-on glass formed using spin-on coating. For example, ILD 74 may be formed of Phospho-Silicate Glass (PSG), Boro-Silicate Glass (BSG), Boron-Doped Phospho-Silicate Glass (BPSG), Tetraethyl Orthosilicate (TEOS) oxide, TiN, SiOC, or other low-k non-porous dielectric materials.

Figure 15:
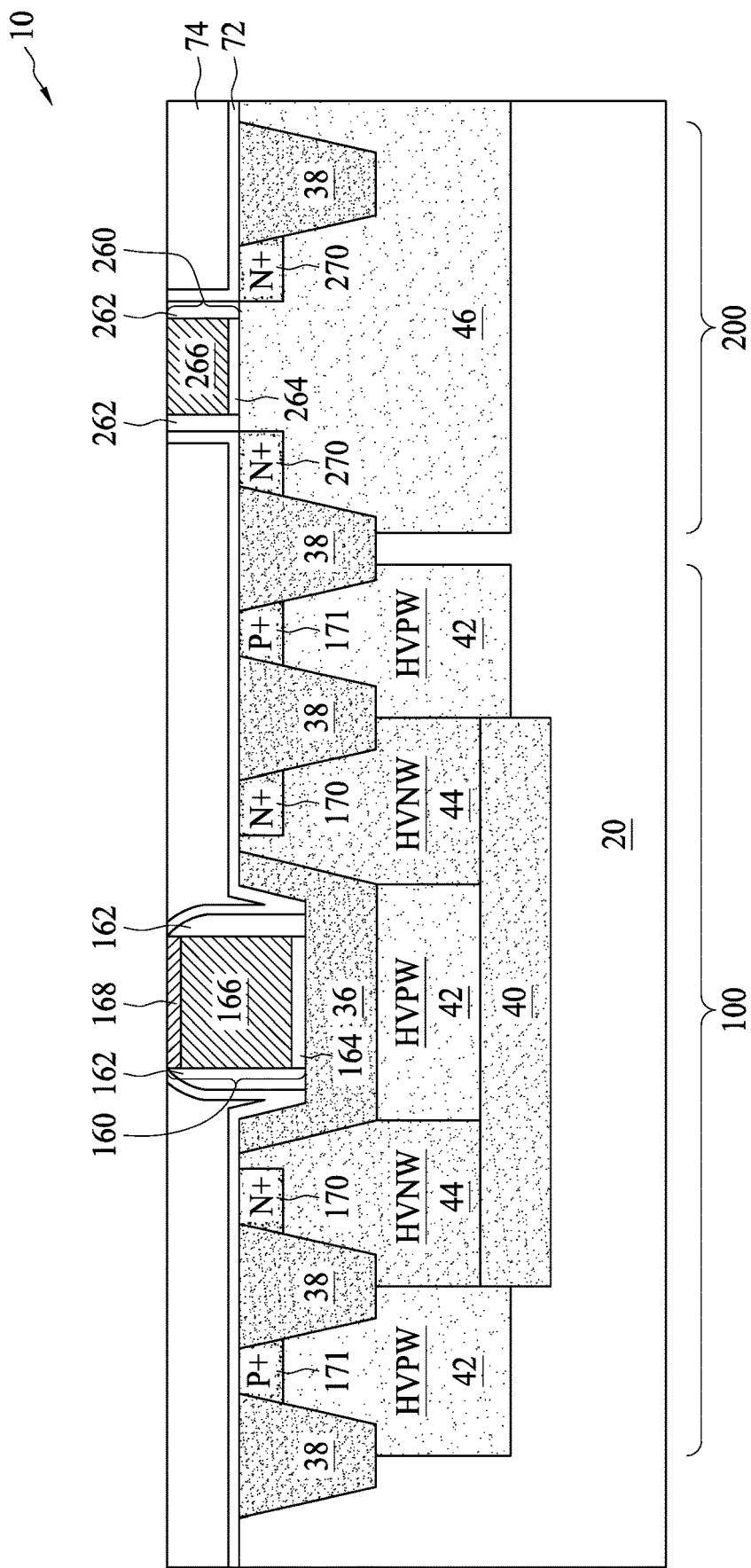

FIG. 15 illustrates a planarization step, which is performed using, for example, CMP. The respective step is shown as step 318 in the process flow shown in FIG. 21. The CMP is performed to remove excess portions of ILD 74 and CESL 72, until gate stack 160 is exposed. Since gate stack 160 is formed in the recess in STI region 36, the top surface of gate stack 160 is lower than the top surface of gate stack 260. Accordingly, in the planarization, the top portion of gate stack 260 is removed, and the height of the remaining gate stack 160 is smaller than the height of remaining gate stack 260. The planarization may be stopped on hard mask 168, if any. Alternatively, hard mask 168 is removed in the planarization, and gate electrode 166 is exposed.

Figure 16:
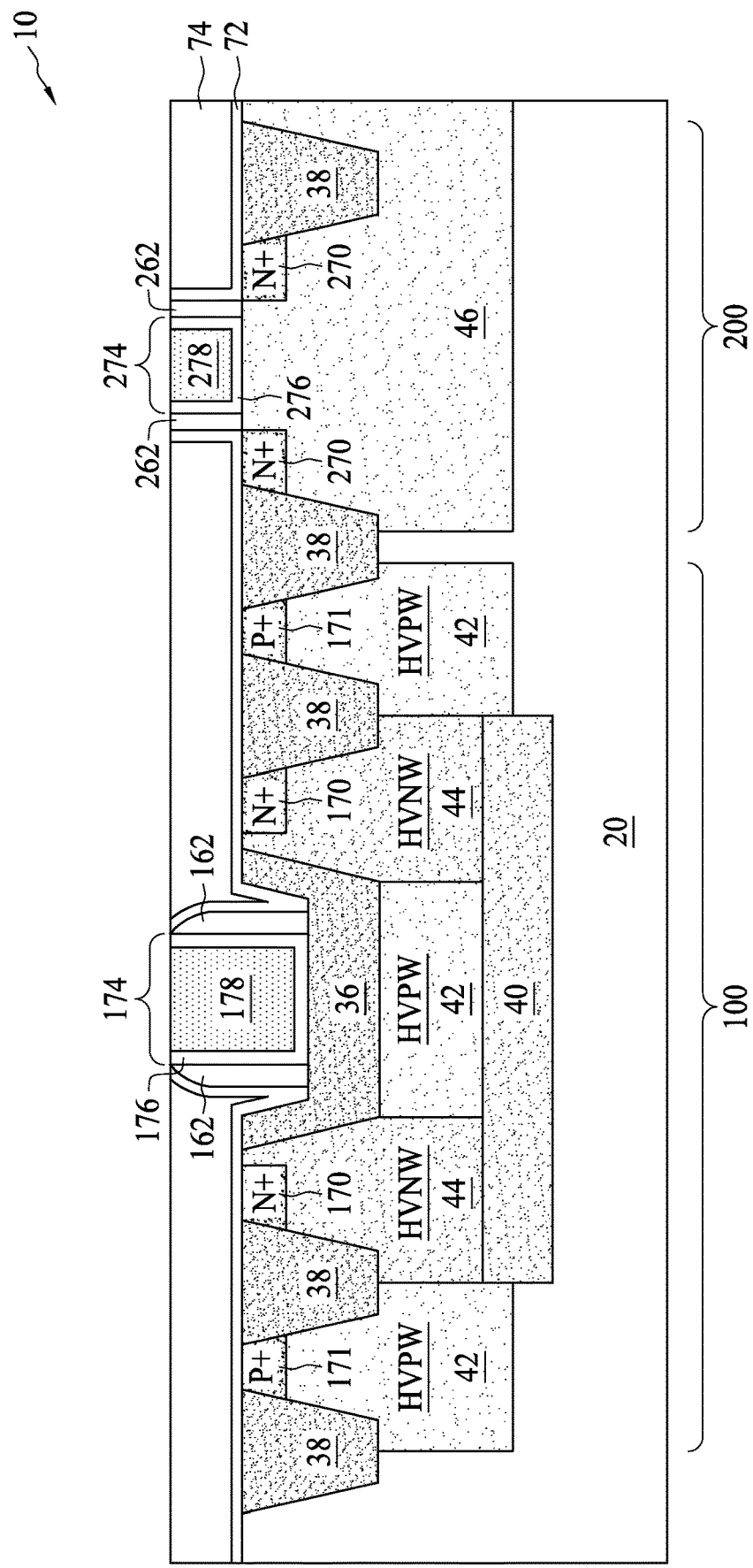

FIG. 16 illustrates the formation of replacement gates 174 and 274 in accordance with some embodiments. Gate stacks 160 and 260 (FIG. 15) are removed, and are replaced by replacement gate stacks 174 and 274, respectively, as shown in FIG. 16. The respective step is shown as step 320 in the process flow shown in FIG. 21. Gate stack 174 includes gate dielectric 176 and gate electrode 178. Gate stack 274 includes gate dielectric 276 and gate electrode 278.

Gate dielectrics 176 and 276 may include a high-k dielectric material such as hafnium oxide, lanthanum oxide, aluminum oxide, or the like. Gate electrodes 178 and 278 may include conductive diffusion barrier layers formed of TiN, TaN, or the like. Gate electrodes 178 and 278 also include conductive layers such as metal-containing layers over the conductive diffusion barrier layers, wherein the metal-containing layers may be formed of cobalt, aluminum, or multi-layers thereof. The formation methods include PVD, CVD, or the like. A planarization step (for example, a CMP) is then performed to remove excess portions of the gate dielectrics and gate electrodes, leaving the structure in FIG. 16.

Figure 17:
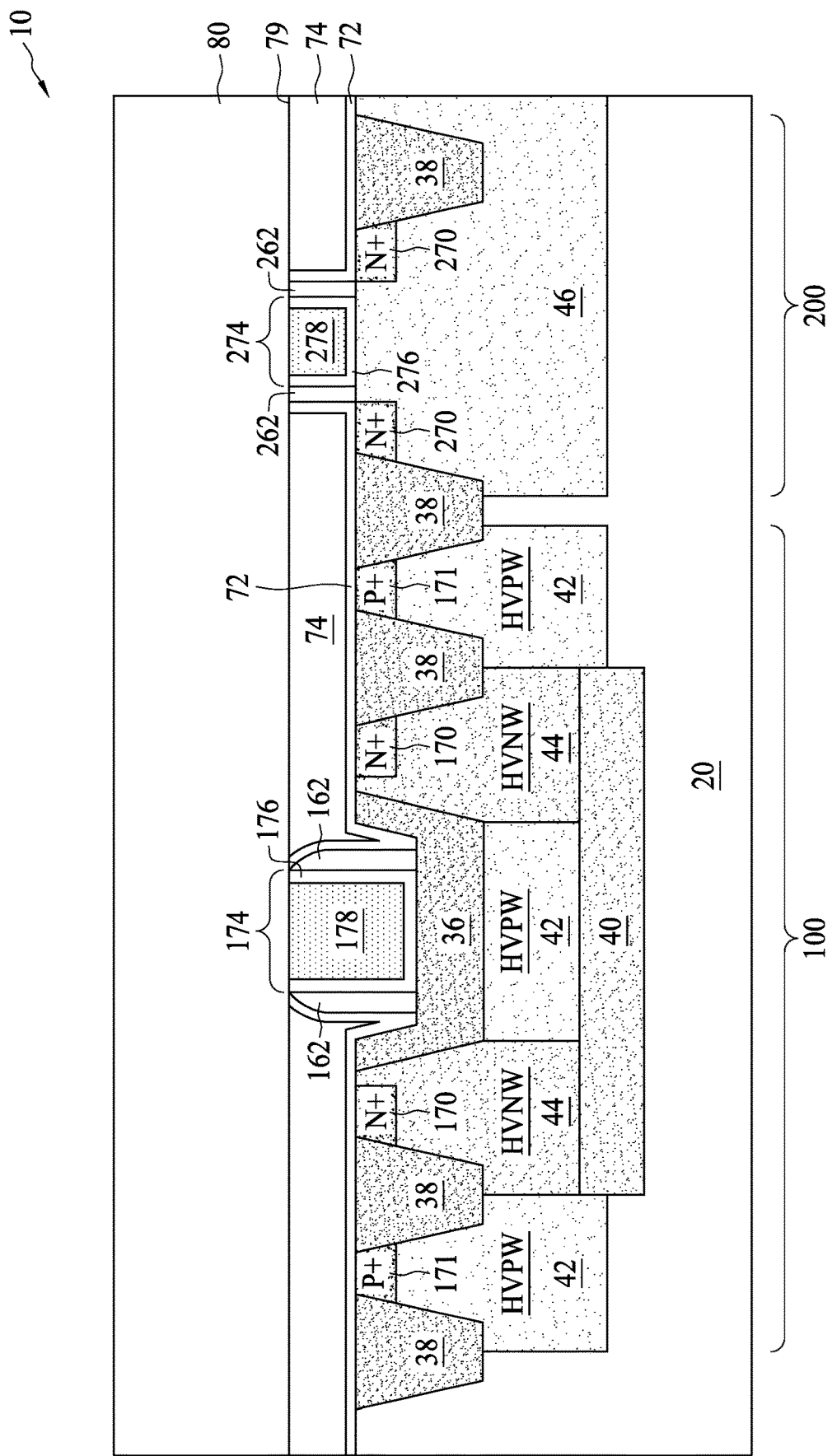

FIG. 17 illustrates the formation of ILD 80 over replacement gates 174 and 274. The respective step is shown as step 322 in the process flow shown in FIG. 21. ILD 80 may be formed of a material selected from the same candidate materials for forming ILD 74. The materials of ILD 74 and ILD 80 may be the same or different from each other. Since ILD 74 and ILD 80 are formed in different process steps, there may be a distinguishable interface 79 between ILD 74 and ILD 80, regardless of whether ILD 74 and ILD 80 are formed of a same material or different materials. In accordance with other embodiments, there is no distinguishable interface between ILD 74 and ILD 80.

In the embodiments illustrated in FIGS. 16 and 17, replacement gates are formed by replacing dummy gates, and ILD 80 is formed over the replacement gates. In accordance with alternative embodiments, after the planarization as shown in FIG. 15, ILD 80 is formed without replacing gate stacks 160 and 260 with replacement gates. Gate dielectrics 164 and 264 and gate electrodes 166 and 266 thus remain in the final structure.

Figure 18:
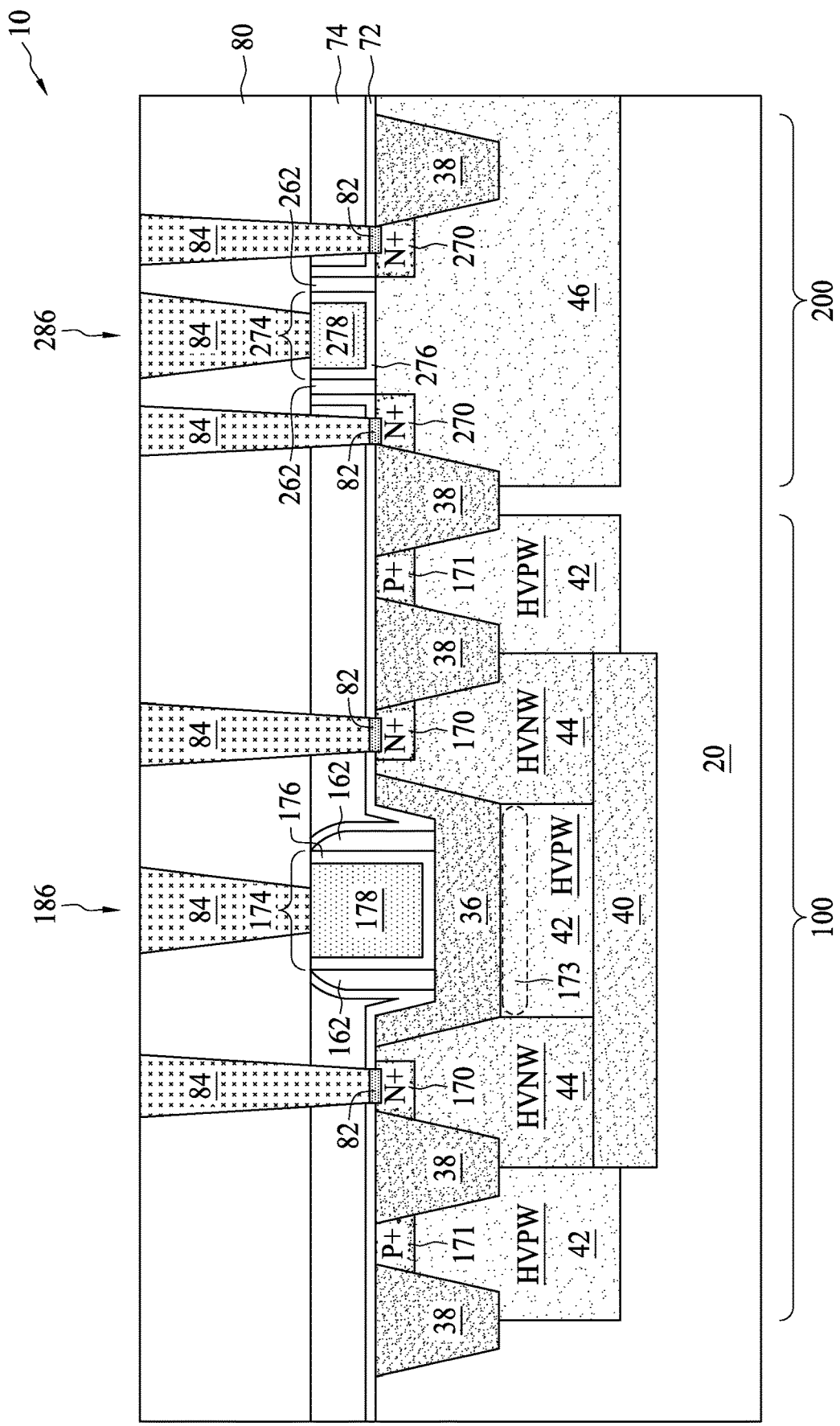

Referring to FIG. 18, source/drain silicide regions 82 and contact plugs 84 are formed. The respective step is shown as step 324 in the process flow shown in FIG. 21. The formation process may include forming contact plug openings in ILD 74 and ILD 80 to expose source/drain regions 170/270 and gate electrodes 176/276, forming a metal layer (not shown) to extend into the contact plug openings, performing an annealing to form source/drain silicide regions 82, removing the un-reacted portions of the metal layer, and filling the contact plug openings to form contact plugs 84. In the embodiments in which gate electrodes 166 and 266 (FIG. 15) are not replaced, gate silicides (not shown) may also be formed on the top of gate electrodes 166 and 266. MOS devices 186 and 286 are thus formed. MOS device 186 includes gate electrode 178, gate dielectric (including 36 and 176), and source/drain regions 170. MOS device 286 includes gate electrode 278, gate dielectric 276, and source/drain regions 270.

MOS device 186 is a HV MOS device. MOS device 286 is a MV MOS device or a LV MOS device, wherein the thickness of gate dielectric 276 (and 176) is selected to suit to the operation voltage levels of MOS device 286. The gate dielectric of HV MOS device 186 includes the remaining portion of STI region 36, which is thick enough to sustain the high voltage. In addition, gate dielectric 176 may also be formed as a part of the gate dielectric of HV MOS device 186. MV/LV MOS device 286 has gate dielectric 276, which is thinner than the thickness of gate dielectric 36. In addition, gate dielectrics 176 and 276 may be formed in a same formation process, and thus have a same thickness, and are formed of a same dielectric material.

FIG. 19 illustrates a top view of portions of HV MOS device, wherein source/drain regions 170 are illustrated. The source region 170 may be spaced apart from STI region 360, or may contact edge 36' of STI region 360.

Figure 20:
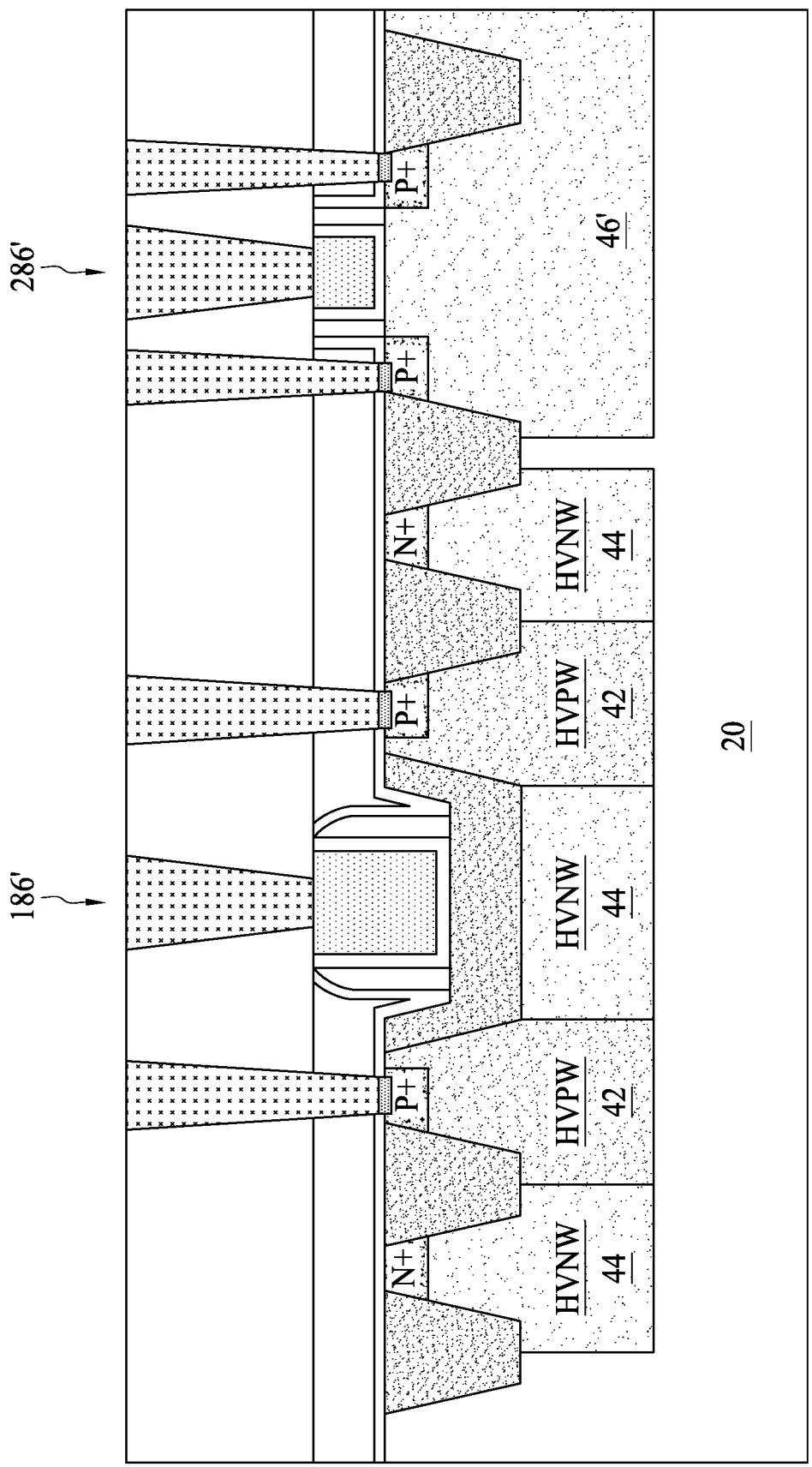
FIG. 20 illustrates a cross-sectional view of a p-type HVMOS device and a p-type MV/LV MOS device in accordance with some embodiments.

FIG. 20 illustrates a cross-sectional view of p-type HV MOS device 186' and p-type MOS device 286' (a LV or MV device), which is formed on the same semiconductor substrate 20 as n-type MOS devices 186 and 286. The illustrated regions in FIG. 20 are marked using same reference numerals as in FIG. 18 with a sign (') added to show they are corresponding regions in FIG. 18. The materials and the formation processes may be realized through the formation of MOS devices 186 and 286 (FIG. 18), with the conductivity types of various illustrated regions in FIG. 20 inverted from the corresponding regions shown in FIG. 18.

The embodiments of the present disclosure have some advantageous features. It is desirable to make HV MOS devices and LV/MV devices to share the processes for forming replacement gates in order to reduce manufacturing cost. However, HV MOS devices have thick gate dielectrics, and hence the top surfaces of the gate dielectrics of HV MOS devices may be at substantially the same level as, or even higher than, the top surfaces of the dummy gate electrodes of the LV/MV MOS devices. As a result, the planarization for exposing the dummy gate electrodes of the LV/MV MOS devices may result in the full removal of the dummy gate electrodes of the HV MOS devices. This means replacement gates are unable to be formed for HV MOS devices by sharing the same process for forming replacement gates for LV/MV MOS devices. By recessing STI regions and forming the gate electrodes of the HV MOS devices in the recesses, the height difference between the top surfaces of the HV MOS device and LV/MV MOS devices is reduced, and the planarization may be performed without causing the full removal of the dummy gate electrodes of HV MOS devices. In addition, in accordance with the embodiments of the present disclosure, the STI regions are used as the gate dielectrics of the HV MOS devices, and hence the production cost is reduced.

In accordance with some embodiments of the present disclosure, a method includes forming an isolation region extending into a semiconductor substrate, etching a top portion of the isolation region to form a recess in the isolation region, and forming a gate stack extending into the recess and overlapping a lower portion of the isolation region. A source region and a drain region are formed on opposite sides of the gate stack. The gate stack, the source region, and the drain region are parts of a MOS device.

In accordance with some embodiments of the present disclosure, a method includes forming a first and a second STI region extending from a top surface of a semiconductor substrate into the semiconductor substrate, and etching the first STI region to form a recess extending from a top surface of the first STI region into the first STI region. The first STI region includes a lower portion underlying the recess. The method further includes forming a first gate stack overlapping the lower portion of the first STI region, forming a second gate stack over and contacting a top surface of the semiconductor substrate, forming first source/drain regions on opposite sides of the first gate stack, and forming second source/drain regions on opposite sides of the second gate stack. One of the second source/drain regions contacts a sidewall of the second STI region. An ILD is formed over the first source/drain regions and the second source/drain regions. A planarization is performed to make a top surface of the first gate stack to be coplanar with a top surface of the second gate stack.

In accordance with some embodiments of the present disclosure, an integrated circuit structure includes a semiconductor substrate. An HVMOS device includes a gate dielectric having a portion lower than a top surface of the semiconductor substrate. A gate electrode is over the gate dielectric, wherein the gate electrode has a portion lower than the top surface of the semiconductor substrate. A source region and a drain region are on opposite sides of the gate dielectric.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming an isolation region extending into a semiconductor substrate;
   etching a top portion of the isolation region to form a recess in the isolation region;
   forming a gate stack, wherein the forming the gate stack comprises depositing a gate dielectric and a gate electrode, and both a portion of the gate dielectric and a portion of the gate electrode are in the recess, wherein an entirety of the gate stack overlaps a portion of the isolation region;
   when the gate stack is formed, simultaneously forming an additional gate stack, wherein the additional gate stack is directly over an un-recessed portion of the semiconductor substrate;
   performing a planarization to level a top surface of the gate stack and the additional gate stack; and
   forming a source region and a drain region on opposite sides of the gate stack, wherein the gate stack, the source region, and the drain region are parts of a Metal-Oxide-Semiconductor (MOS) device, and the additional gate stack is a part of an additional MOS device.

2. The method of claim 1, wherein the MOS device is a High-Voltage (HV) MOS device, and the method further comprises:
   implanting the semiconductor substrate to form an HV n-well region and an HV p-well region, wherein at least one of the HV n-well region and an HV p-well region comprises a portion underlying the isolation region.

3. The method of claim 1, wherein the forming the gate stack further comprises etching some portions of the deposited gate electrode and the deposited gate dielectric to expose portions of the isolation region underlying the deposited gate dielectric.

4. The method of claim 1, wherein the isolation region has a top surface substantially coplanar with a top surface of the semiconductor substrate.

5. The method of claim 1 further comprising replacing the gate stack and the additional gate stack with a first replacement gate stack and a second replacement gate stack, respectively.

6. The method of claim 1, wherein a bottom surface of the gate stack is lower than a top surface of the semiconductor substrate, and a bottom surface of the additional gate stack is higher than a top surface of the semiconductor substrate.

7. The method of claim 1 further comprising forming an inter-layer dielectric over the source region and the drain region, wherein the inter-layer dielectric extends into the recess.

8. The method of claim 1, wherein the gate stack acts as a stop layer for the planarization, and a top portion of the additional gate stack is removed by the planarization.

9. A method comprising:
   forming a first and a second Shallow Trench Isolation (STI) region extending from a top surface of a semiconductor substrate into the semiconductor substrate;
   etching the first STI region to form a recess extending from a top surface of the first STI region into the first STI region, wherein the first STI region comprises a lower portion underlying the recess;
   forming a first gate stack overlapping the lower portion of the first STI region;
   forming a second gate stack over and contacting a top surface of the semiconductor substrate;
   forming first source/drain regions on opposite sides of the first gate stack;
   forming second source/drain regions on opposite sides of the second gate stack, wherein one of the second source/drain regions contacts a sidewall of the second STI region;
   filling an Inter-Layer Dielectric (ILD) over the first source/drain regions and the second source/drain regions; and
   performing a planarization to make a top surface of the first gate stack to be coplanar with a top surface of the second gate stack, wherein the first gate stack acts as a stop layer for the planarization, and a top portion of the second gate stack is removed by the planarization.

10. The method of claim 9, wherein the first gate stack is a part of a high-voltage Metal-Oxide-Semiconductor (MOS) device, and the second gate stack is a part of a medium-voltage MOS device or a low-voltage MOS device.

11. The method of claim 10, wherein the lower portion of the first STI region acts as a portion of a gate dielectric of the HV MOS device.

12. The method of claim 9, wherein a portion of the first gate stack is lower than the top surface of the semiconductor substrate, and an entirety of the second gate stack is higher than a top surface of the semiconductor substrate.

13. The method of claim 9 further comprising replacing the first gate stack and the second gate stack with a first replacement gate and a second replacement gate, respectively.

14. A method comprising:
   forming an isolation region extending into a semiconductor substrate;
   etching a top portion of the isolation region to form a recess in the isolation region;
   forming a gate stack extending into the recess and overlapping a lower portion of the isolation region;
   forming a source region and a drain region on opposite sides of the gate stack, wherein in a top view of the source region and the drain region, a straight line connecting the source region to the drain region passes through a middle portion of the recess, and wherein the gate stack, the source region, and the drain region are parts of a Metal-Oxide-Semiconductor (MOS) device;
   when the gate stack is formed, simultaneously forming an additional gate stack for an additional MOS device, wherein the additional gate stack is directly over an un-recessed portion of the semiconductor substrate; and
   performing a planarization to level top surfaces of the gate stack and the additional gate stack, wherein the gate stack acts as a stop layer for the planarization, and a top portion of the additional gate stack is removed by the planarization.

15. The method of claim 14, wherein the MOS device is a High-Voltage (HV) MOS device, and the method further comprises:
implanting the semiconductor substrate to form an HV n-well region and an HV p-well region, wherein at least one of the HV n-well region and an HV p-well region comprises a portion underlying the isolation region.

16. The method of claim 14, wherein a middle portion of the top portion of the isolation region is recessed, and after the etching, the top portion of the isolation region further comprises additional portions remaining on opposite sides of the recessed middle portion.

17. The method of claim 14, wherein the isolation region has a top surface substantially coplanar with a top surface of the semiconductor substrate.

18. The method of claim 14 comprising simultaneously forming the isolation region and an additional isolation region, wherein during the etching, the additional isolation region is not etched.

19. The method of claim 14 further comprising replacing the gate stack and the additional gate stack with a first replacement gate stack and a second replacement gate stack, respectively.

20. The method of claim 14, wherein the isolation region comprises un-recessed portions on opposing sides of the recess, wherein the un-recessed portions are un-recessed in the etching the top portion of the isolation region, and wherein the method further comprises forming gate spacers on opposing sides of the gate stack, and the gate spacers are spaced apart from the un-recessed portions.

* * * * *